US008298685B2

United States Patent
Moriwaki et al.

(10) Patent No.: US 8,298,685 B2
(45) Date of Patent: Oct. 30, 2012

(54) BLOCK COPOLYMER AND POLYMER LIGHT-EMITTING DEVICE

(75) Inventors: Shota Moriwaki, Tsukuba (JP); Hidenobu Kakimoto, Tsukuba (JP); Tomoya Nakatani, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 565 days.

(21) Appl. No.: 12/525,147

(22) PCT Filed: Feb. 1, 2008

(86) PCT No.: PCT/JP2008/051623
§ 371 (c)(1),
(2), (4) Date: Jul. 30, 2009

(87) PCT Pub. No.: WO2008/093822
PCT Pub. Date: Aug. 7, 2008

(65) Prior Publication Data
US 2010/0108993 A1    May 6, 2010

(30) Foreign Application Priority Data
Feb. 1, 2007    (JP) .................................. 2007-022766

(51) Int. Cl.
*H01L 51/54*    (2006.01)
*C08G 75/00*    (2006.01)
*C08L 53/00*    (2006.01)

(52) U.S. Cl. .......... 428/690; 525/535; 524/500; 257/40; 428/917; 313/504; 313/506

(58) Field of Classification Search .................. None
See application file for complete search history.

(56) References Cited

U.S. PATENT DOCUMENTS

| 6,861,502 B1 | 3/2005 | Towns et al. | |
|---|---|---|---|
| 6,916,902 B2 * | 7/2005 | Inbasekaran et al. | 528/397 |
| 7,696,284 B2 * | 4/2010 | Falcou et al. | 525/370 |
| 2003/0045642 A1 | 3/2003 | Wu et al. | |
| 2003/0186079 A1 * | 10/2003 | Towns et al. | 428/690 |
| 2004/0100804 A1 | 5/2004 | Noguchi et al. | |
| 2004/0115473 A1 | 6/2004 | Burroughes et al. | |
| 2004/0260090 A1 | 12/2004 | Treacher et al. | |
| 2005/0038223 A1 | 2/2005 | Becker et al. | |
| 2005/0263758 A1 | 12/2005 | Treacher et al. | |
| 2006/0229427 A1 | 10/2006 | Becker et al. | |
| 2010/0033085 A1 * | 2/2010 | Nakatani et al. | 313/504 |
| 2010/0096980 A1 * | 4/2010 | Nakatani et al. | 313/504 |
| 2011/0127512 A1 * | 6/2011 | Goto et al. | 257/40 |

FOREIGN PATENT DOCUMENTS

| JP | 2003-64163 A | 3/2003 |
|---|---|---|
| JP | 2004-534863 A | 11/2004 |
| JP | 2005-515264 A | 5/2005 |
| JP | 2005-511807 A | 7/2005 |
| WO | 00/46321 A1 | 8/2000 |
| WO | 01/49768 A2 | 7/2001 |
| WO | 03/007395 A1 | 1/2003 |
| WO | 2005/014688 A2 | 2/2005 |

OTHER PUBLICATIONS

Liu et al., Advanced Materials, (2005), 17(24), pp. 2974-2978.*
Muller et al., Proceedings of SPIE, vol. 5214, pp. 21-30.*
Muller et al., Nature, (2003), 421(6925), pp. 829-833.*
State Intellectual Property of People's Republic of China, "First Office Action," issued in connection with Chinese Patent Application No. 200880003659.5, dated Feb. 23, 2011.

* cited by examiner

*Primary Examiner* — Dawn L. Garrett
(74) *Attorney, Agent, or Firm* — Sughrue Mion, PLLC

(57) ABSTRACT

Disclosed is a block copolymer characterized by containing a block (A) containing two or more different repeating units respectively composed of a specific divalent heterocyclic group, and a repeating unit composed of an arylene group, and a block (B) containing a repeating unit composed of an arylene group and a repeating unit composed of a divalent aromatic amine residue. Also disclosed are a composition containing a solvent, a light-emitting material other than the block copolymer, a hole-transporting material other than the block copolymer, an electron-transporting material other than the block copolymer or a combination of two or more of them, in addition to the block copolymer; a light-emitting thin film characterized by containing the block copolymer; and a polymer light-emitting device characterized by having an anode, a cathode and an organic layer containing the block copolymer and arranged between the anode and the cathode.

15 Claims, No Drawings

BLOCK COPOLYMER AND POLYMER LIGHT-EMITTING DEVICE

TECHNICAL FIELD

The present invention relates to a block copolymer and a polymer light-emitting device using the same.

BACKGROUND ART

Since high-molecular-weight light-emitting materials and charge transport materials are useful as materials used for an organic layer in a light-emitting device, and the like, various types have been studied, and as an example, a copolymer of a divalent group represented by the following formula and a fluorenediyl group has been reported (for example, see PATENT DOCUMENT 1).

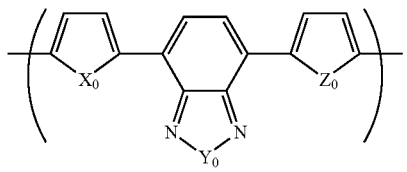

wherein $X_0$, $Y_0$, and $Z_0$ are each independently O, S, $C(R_0)_2$, $Si(R_0)_2$, or $NR_0$, and each $R_0$ is independently alkyl, aryl, or H.

DISCLOSURE OF THE INVENTION

Problems to be Solved by the Invention

However, when the above copolymer is used as a light-emitting material for a light-emitting device, its life is not sufficient yet.

It is an object of the present invention to provide a block copolymer that can provide a light-emitting device with long life when it is used as a light-emitting material for a light-emitting device.

Means for Solving the Problems

The present invention provides a block copolymer characterized by comprising:

a block (A) comprising two or more different types of repeating units represented by the following formula (I), and a repeating unit represented by the following formula (II); and a block (B) comprising a repeating unit represented by the following formula (II), and a repeating unit represented by the following formula (III).

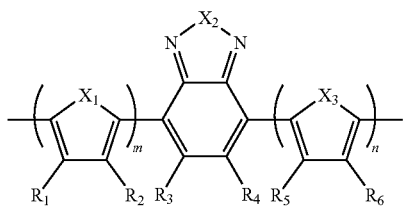

wherein $R_1$, $R_2$, $R_3$, $R_4$, $R_5$, and $R_6$ independently represent a hydrogen atom, a halogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a cyano group, or a nitro group, m and n independently represent an integer of 1 to 3, and $X_1$, $X_2$, and $X_3$ independently represent an oxygen atom, a sulfur atom, or $-C(R_7)=C(R_8)-$ wherein $R_7$ and $R_8$ independently represent a hydrogen atom, a halogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a cyano group, or a nitro group, provided that when a plurality of at least one of $R_1$, $R_2$, $R_5$, $R_6$, $X_1$, and $X_3$ are present, the plurality of atoms or groups may be the same or different, $$-Ar_1- \quad (II)$$

wherein $Ar_1$ represents an arylene group, and $$-Ar_2- \quad (III)$$

wherein $Ar_2$ represents a divalent aromatic amine residue.

Secondly, the present invention provides a composition comprising:

the block copolymer; and a solvent, a light-emitting material other than the block copolymer, a hole transport material other than the block copolymer, or an electron transport material other than the block copolymer, or a combination of two or more thereof.

Thirdly, the present invention provides a light-emitting thin film characterized by comprising the block copolymer.

Fourthly, the present invention provides a polymer light-emitting device characterized by comprising:

an anode;

a cathode; and an organic layer comprising the block copolymer and provided between the anode and the cathode.

Advantage of the Invention

The block copolymer of the present invention is useful as the light-emitting material, hole transport material, and electron transport material of a light-emitting device, and provides a light-emitting device in which time until luminance is reduced to 90% (hereinafter referred to as 10% luminance reduction life) is long, particularly when the block copolymer is used as the light-emitting material of the light-emitting device. Therefore, a light-emitting device comprising the block copolymer of the present invention can be used for a curved and a planar light source for the backlight of a liquid crystal display or for illumination, a segment type display device, a dot matrix flat panel display, and the like.

BEST MODE FOR CARRYING OUT THE INVENTION

Description of Terms

Terms commonly used in this specification will be described below.

As a halogen atom, a fluorine atom, a chlorine atom, a bromine atom, and an iodine atom are illustrated.

The term "$C_x$ to $C_y$" (x and y are positive integers satisfying x<y) represents that the number of the carbon atoms of an organic group described with this term is x to y.

An alkyl group means an unsubstituted alkyl group and an alkyl group substituted with a halogen atom or the like and includes both a linear alkyl group and a cyclic alkyl group (cycloalkyl group). The alkyl group may have a branch. The number of the carbon atoms of the alkyl group is usually about 1 to 20, preferably about 1 to 15, and more preferably about 1 to 10. The alkyl group includes, for example, a methyl group, an ethyl group, a propyl group, an isopropyl group, a butyl group, an isobutyl group, an s-butyl group, a t-butyl group, a pentyl group, an isoamyl group, a hexyl group, a cyclohexyl group, a heptyl group, an octyl group, a 2-ethylhexyl group, a nonyl group, a decyl group, a 3,7-dimethyloctyl group, a dodecyl group, a trifluoromethyl group, a pentafluoroethyl group, a perfluorobutyl group, a perfluorohexyl group, and a perfluorooctyl group. A $C_1$ to $C_{12}$ alkyl group includes, for example, a methyl group, an ethyl group, a propyl group, an isopropyl group, a butyl group, an isobutyl group, an s-butyl group, a t-butyl group, a pentyl group, an isoamyl group, a hexyl group, a cyclohexyl group, a heptyl group, an octyl group, a nonyl group, a decyl group, and a dodecyl group.

An alkoxy group means an unsubstituted alkoxy group and an alkoxy group substituted with a halogen atom, an alkoxy group, or the like, and includes both a linear alkoxy group and a cyclic alkoxy group (cycloalkoxy group). The alkoxy group may have a branch. The number of the carbon atoms of the alkoxy group is usually about 1 to 20, preferably about 1 to 15, and more preferably about 1 to 10. The alkoxy group includes, for example, a methoxy group, an ethoxy group, a propyloxy group, an isopropyloxy group, a butoxy group, an isobutoxy group, an s-butoxy group, a t-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, a dodecyloxy group, a trifluoromethoxy group, a pentafluoroethoxy group, a perfluorobutoxy group, a perfluorohexyloxy group, a perfluorooctyloxy group, a methoxymethyloxy group, and a 2-methoxyethyloxy group. A $C_1$ to $C_{12}$ alkoxy group includes, for example, a methoxy group, an ethoxy group, a propyloxy group, an isopropyloxy group, a butoxy group, an isobutoxy group, an s-butoxy group, a t-butoxy group, a pentyloxy group, a hexyloxy group, a cyclohexyloxy group, a heptyloxy group, an octyloxy group, a 2-ethylhexyloxy group, a nonyloxy group, a decyloxy group, a 3,7-dimethyloctyloxy group, and a dodecyloxy group.

An alkylthio group means an unsubstituted alkylthio group and an alkylthio group substituted with a halogen atom or the like and includes both a linear alkylthio group and a cyclic alkylthio group (cycloalkylthio group). The alkylthio group may have a branch. The number of the carbon atoms of the alkylthio group is usually about 1 to 20, preferably about 1 to 15, and more preferably about 1 to 10. The alkylthio group includes, for example, a methylthio group, an ethylthio group, a propylthio group, an isopropylthio group, a butylthio group, an isobutylthio group, an s-butylthio group, a t-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, a dodecylthio group, and a trifluoromethylthio group. A $C_1$ to $C_{12}$ alkylthio group includes, for example, a methylthio group, an ethylthio group, a propylthio group, an isopropylthio group, a butylthio group, an isobutylthio group, an s-butylthio group, a t-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, and a dodecylthio group.

An aryl group is a remaining atomic group obtained by removing from an aromatic hydrocarbon one hydrogen atom bonded to a carbon atom constituting an aromatic ring and means an unsubstituted aryl group and an aryl group substituted with a halogen atom, an alkoxy group, an alkyl group, or the like. The aryl group also includes one having a condensed ring, and one in which two or more independent benzene rings or condensed rings are bonded via a single bond or a divalent organic group, for example, an alkenylene group, such as a vinylene group. The number of the carbon atoms of the aryl group is usually about 6 to 60, preferably about 7 to 48, and more preferably about 7 to 30. The aryl group includes, for example, a phenyl group, a $C_1$ to $C_{12}$ alkoxyphenyl group, a $C_1$ to $C_n$ alkylphenyl group, a 1-naphthyl group, a 2-naphthyl group, a 1-anthracenyl group, a 2-anthracenyl group, a 9-anthracenyl group, and a pentafluorophenyl group. Among them, a $C_1$ to $C_{12}$ alkoxyphenyl group and a $C_1$ to $C_{12}$ alkylphenyl group are preferred.

The $C_1$ to $C_{12}$ alkoxyphenyl group includes, for example, a methoxyphenyl group, an ethoxyphenyl group, a propyloxyphenyl group, an isopropyloxyphenyl group, a butyloxyphenyl group, an isobutyloxyphenyl group, a t-butyloxyphenyl group, a pentyloxyphenyl group, a hexyloxyphenyl group, and an octyloxyphenyl group.

The $C_1$ to $C_{12}$ alkylphenyl group includes, for example, a methylphenyl group, an ethylphenyl group, a dimethylphenyl group, a propylphenyl group, a mesityl group, a methylethylphenyl group, an isopropylphenyl group, a butylphenyl group, an isobutylphenyl group, a t-butylphenyl group, a pentylphenyl group, an isoamylphenyl group, a hexylphenyl group, a heptylphenyl group, an octylphenyl group, a nonylphenyl group, a decylphenyl group, and a dodecylphenyl group.

An aryloxy group means an unsubstituted aryloxy group and an aryloxy group substituted with a halogen atom, an alkoxy group, an alkyl group, or the like. The number of the carbon atoms of the aryloxy group is usually about 6 to 60, preferably about 7 to 48, and more preferably about 7 to 30. The aryloxy group includes, for example, a phenoxy group, a $C_1$ to $C_{12}$ alkoxyphenoxy group, a $C_1$ to $C_{12}$ alkylphenoxy group, a 1-naphthyloxy group, a 2-naphthyloxy group, and a pentafluorophenyloxy group. Among them, a $C_1$ to $C_{12}$ alkoxyphenoxy group and a $C_1$ to $C_{12}$ alkylphenoxy group are preferred.

The $C_1$ to $C_{12}$ alkoxyphenoxy group includes, for example, a methoxyphenoxy group, an ethoxyphenoxy group, a propyloxyphenoxy group, an isopropyloxyphenoxy group, a butyloxyphenoxy group, an isobutyloxyphenoxy group, a t-butyloxyphenoxy group, a pentyloxyphenoxy group, a hexyloxyphenoxy group, and an octyloxyphenoxy group.

The $C_1$ to $C_{12}$ alkylphenoxy group includes, for example, a methylphenoxy group, an ethylphenoxy group, a dimethylphenoxy group, a propylphenoxy group, a 1,3,5-trimethylphenoxy group, a methylethylphenoxy group, an isopropylphenoxy group, a butylphenoxy group, an isobutylphenoxy group, an s-butylphenoxy group, a t-butylphenoxy group, a pentylphenoxy group, an isoamylphenoxy group, a hexylphenoxy group, a heptylphenoxy group, an octylphenoxy group, a nonylphenoxy group, a decylphenoxy group, and a dodecylphenoxy group.

An arylthio group means an unsubstituted arylthio group and an arylthio group substituted with a halogen atom, an alkoxy group, an alkyl group, or the like. The number of the carbon atoms of the arylthio group is usually about 6 to 60, preferably about 7 to 48, and more preferably about 7 to 30. The arylthio group includes, for example, a phenylthio group, a $C_1$ to $C_{12}$ alkoxyphenylthio group, a $C_1$ to $C_{12}$ alkylphenylthio group, a 1-naphthylthio group, a 2-naphthylthio group, and a pentafluorophenylthio group.

An arylalkyl group means an unsubstituted arylalkyl group and an arylalkyl group substituted with a halogen atom, an alkoxy group, an alkyl group, or the like. The number of the carbon atoms of the arylalkyl group is usually about 7 to 60, preferably about 7 to 48, and more preferably about 7 to 30. The arylalkyl group includes, for example, a phenyl-$C_1$ to $C_{12}$ alkyl group, a $C_1$ to $C_{12}$ alkoxyphenyl-$C_1$ to $C_{12}$ alkyl group, a $C_1$ to $C_{12}$ alkylphenyl-$C_1$ to $C_{12}$ alkyl group, a 1-naphthyl-$C_1$ to $C_{12}$ alkyl group, and a 2-naphthyl-$C_1$ to $C_{12}$ alkyl group.

An arylalkoxy group means an unsubstituted arylalkoxy group and an arylalkoxy group substituted with a halogen atom, an alkoxy group, an alkyl group, or the like. The number of the carbon atoms of the arylalkoxy group is usually about 7 to 60, preferably about 7 to 48, and more preferably about 7 to 30. The arylalkoxy group includes, for example, a phenyl-$C_1$ to $C_{12}$ alkoxy group, a $C_1$ to $C_{12}$ alkoxyphenyl-$C_1$ to $C_{12}$ alkoxy group, a $C_1$ to $C_{12}$ alkylphenyl-$C_1$ to $C_{12}$ alkoxy group, a 1-naphthyl-$C_1$ to $C_{12}$ alkoxy group, and a 2-naphthyl-$C_1$ to $C_{12}$ alkoxy group.

An arylalkylthio group means an unsubstituted arylalkylthio group and an arylalkylthio group substituted with a halogen atom, an alkoxy group, an alkyl group, or the like. The number of the carbon atoms of the arylalkylthio group is usually about 7 to 60, preferably about 7 to 48, and more preferably about 7 to 30. The arylalkylthio group includes, for example, a phenyl-$C_1$ to $C_{12}$ alkylthio group, a $C_1$ to $C_{12}$ alkoxyphenyl-$C_1$ to $C_{12}$ alkylthio group, a $C_1$ to $C_{12}$ alkylphenyl-$C_1$ to $C_{12}$ alkylthio group, a 1-naphthyl-$C_1$ to $C_{12}$ alkylthio group, and a 2-naphthyl-$C_1$ to $C_{12}$ alkylthio group.

An arylalkenyl group means an unsubstituted arylalkenyl group and an arylalkenyl group substituted with a halogen atom, an alkoxy group, an alkyl group, or the like. The number of the carbon atoms of the arylalkenyl group is usually about 8 to 60, preferably about 8 to 48, and more preferably about 8 to 30. The arylalkenyl group includes, for example, a phenyl-$C_2$ to $C_{12}$ alkenyl group, a $C_1$ to $C_{12}$ alkoxyphenyl-$C_2$ to $C_{12}$ alkenyl group, a $C_1$ to $C_{12}$ alkylphenyl-$C_2$ to $C_{12}$ alkenyl group, a 1-naphthyl-$C_2$ to $C_{12}$ alkenyl group, and a 2-naphthyl-$C_2$ to $C_{12}$ alkenyl group. Among them, a $C_1$ to $C_{12}$ alkoxyphenyl-$C_2$ to $C_{12}$ alkenyl group and a $C_1$ to $C_{12}$ alkylphenyl-$C_2$ to $C_{12}$ alkenyl group are preferred.

The $C_2$ to $C_{12}$ alkenyl group includes, for example, a vinyl group, a 1-propenyl group, a 2-propenyl group, a 1-butenyl group, a 2-butenyl group, a 1-pentenyl group, a 2-pentenyl group, a 1-hexenyl group, a 2-hexenyl group, and a 1-octenyl group.

An arylalkynyl group means an unsubstituted arylalkynyl group and an arylalkynyl group substituted with a halogen atom, an alkoxy group, an alkyl group, or the like. The number of the carbon atoms of the arylalkynyl group is usually about 8 to 60, preferably about 8 to 48, and more preferably about 8 to 30. The arylalkynyl group includes, for example, a phenyl-$C_2$ to $C_{12}$ alkynyl group, a $C_1$ to $C_{12}$ alkoxyphenyl-$C_2$ to $C_{12}$ alkynyl group, a $C_1$ to $C_{12}$ alkylphenyl-$C_2$ to $C_{12}$ alkynyl group, a 1-naphthyl-$C_2$ to $C_{12}$ alkynyl group, and a 2-naphthyl-$C_2$ to $C_{12}$ alkynyl group. Among them, a $C_1$ to $C_{12}$ alkoxyphenyl-$C_2$ to $C_{12}$ alkynyl group and a $C_1$ to $C_{12}$ alkylphenyl-$C_2$ to $C_{12}$ alkynyl group are preferred.

The $C_2$ to $C_{12}$ alkynyl group includes, for example, an ethynyl group, a 1-propynyl group, a 2-propynyl group, a 1-butynyl group, a 2-butynyl group, a 1-pentynyl group, a 2-pentynyl group, a 1-hexynyl group, a 2-hexynyl group, and a 1-octynyl group.

A monovalent heterocyclic group refers to a remaining atomic group obtained by removing one hydrogen atom from a heterocyclic compound and means an unsubstituted monovalent heterocyclic group and a monovalent heterocyclic group substituted with a substituent, such as an alkyl group. The number of the carbon atoms of the monovalent heterocyclic group is usually about 4 to 60, preferably about 4 to 30, and more preferably about 4 to 20, not including the number of the carbon atoms of the substituent. Here, the heterocyclic compound refers to, among organic compounds having a cyclic structure, one containing, as elements constituting a ring, not only a carbon atom, but also a heteroatom, such as an oxygen atom, a sulfur atom, a nitrogen atom, a phosphorus atom, a boron atom, a silicon atom, a selenium atom, a tellurium atom, and an arsenic atom. The monovalent heterocyclic group includes, for example, a thienyl group, a $C_1$ to $C_{12}$ alkylthienyl group, a pyrrolyl group, a furyl group, a pyridyl group, a $C_1$ to $C_{12}$ alkylpyridyl group, a pyridazinyl group, a pyrimidyl group, a pyrazinyl group, a triazinyl group, a pyrrolidyl group, a piperidyl group, a quinolyl group, and an isoquinolyl group. Among them, a thienyl group, a $C_1$ to $C_{12}$ alkylthienyl group, a pyridyl group, and a $C_1$ to $C_{12}$ alkylpyridyl group are preferred.

A heterocyclic thio group means a group in which the hydrogen atom of a mercapto group is substituted with a monovalent heterocyclic group. The heterocyclic thio group includes, for example, a heteroarylthio group, such as a pyridylthio group, a pyridazinylthio group, a pyrimidylthio group, a pyrazinylthio group, and a triazinylthio group.

An amino group means an unsubstituted amino group and an amino group substituted with one or two substituents selected from an alkyl group, an aryl group, an arylalkyl group, and a monovalent heterocyclic group (hereinafter referred to as a substituted amino group). The substituent may further have a substituent (hereinafter sometimes referred to as a secondary substituent). The number of the carbon atoms of the substituted amino group is usually about 1 to 60, preferably about 2 to 48, and more preferably about 2 to 40, not including the number of the carbon atoms of the secondary substituent. The substituted amino group includes, for example, a methylamino group, a dimethylamino group, an ethylamino group, a diethylamino group, a propylamino group, a dipropylamino group, an isopropylamino group, a diisopropylamino group, a butylamino group, an isobutylamino group, an s-butylamino group, a t-butylamino group, a pentylamino group, a hexylamino group, a heptylamino group, an octylamino group, a 2-ethylhexylamino group, a nonylamino group, a decylamino group, a 3,7-dimethyloctylamino group, a dodecylamino group, a cyclopentylamino group, a dicyclopentylamino group, a cyclohexylamino group, a dicyclohexylamino group, a ditrifluoromethylamino group, a phenylamino group, a diphenylamino group, a $C_1$ to $C_{12}$ alkoxyphenylamino group, a di($C_1$ to $C_{12}$ alkoxyphenyl) amino group, a $C_1$ to $C_{12}$ alkylphenylamino group, a di($C_1$ to $C_{12}$ alkylphenyl)amino group, a 1-naphthylamino group, a 2-naphthylamino group, a pentafluorophenylamino group, a pyridylamino group, a pyridazinylamino group, a pyrimidylamino group, a pyrazinylamino group, a triazinylamino group, a phenyl-$C_1$ to $C_{12}$ alkylamino group, a $C_1$ to $C_{12}$ alkoxyphenyl-$C_1$ to $C_{12}$ alkylamino group, a di($C_1$ to $C_{12}$ alkoxyphenyl-$C_1$ to $C_{12}$ alkyl)amino group, a $C_1$ to $C_{12}$ alkylphenyl-$C_1$ to $C_{12}$ alkylamino group, a di($C_1$ to $C_{12}$ alkylphenyl-$C_1$ to $C_{12}$ alkyl)amino group, a 1-naphthyl-$C_1$ to $C_{12}$ alkylamino group, and a 2-naphthyl-$C_1$ to $C_{12}$ alkylamino group.

A silyl group means an unsubstituted silyl group and a silyl group substituted with one, two, or three substituents selected from an alkyl group, an aryl group, an arylalkyl group, and a monovalent heterocyclic group (hereinafter referred to as a substituted silyl group). The substituent may have a secondary substituent. The number of the carbon atoms of the substituted silyl group is usually about 1 to 60, preferably about 3 to 48, and more preferably about 3 to 40, not including the number of the carbon atoms of the secondary substituent. The substituted silyl group includes, for example, a trimethylsilyl group, a triethylsilyl group, a tripropylsilyl group, a tri-isopropylsilyl group, a dimethyl-isopropylsilyl group, a diethyl-isopropylsilyl group, a t-butylsilyldimethylsilyl group, a pentyldimethylsilyl group, a hexyldimethylsilyl group, a heptyldimethylsilyl group, an octyldimethylsilyl group, a 2-ethylhexyl-dimethylsilyl group, a nonyldimethylsilyl group, a decyldimethylsilyl group, a 3,7-dimethyloctyl-dimethylsilyl group, a dodecyldimethylsilyl group, a phenyl-$C_1$ to $C_{12}$ alkylsilyl group, a $C_1$ to $C_{12}$ alkoxyphenyl-$C_1$ to $C_{12}$ alkylsilyl group, a $C_1$ to $C_{12}$ alkylphenyl-$C_1$ to $C_{12}$ alkylsilyl group, a 1-naphthyl-$C_1$ to $C_{12}$ alkylsilyl group, a 2-naphthyl-$C_1$ to $C_{12}$ alkylsilyl group, a phenyl-$C_1$ to $C_{12}$ alkyldimethylsilyl group, a triphenylsilyl group, a tri-p-xylylsilyl group, a tribenzylsilyl group, a diphenylmethylsilyl group, a t-butyldiphenylsilyl group, and a dimethylphenylsilyl group.

An acyl group means an unsubstituted acyl group and an acyl group substituted with a halogen atom or the like. The number of the carbon atoms of the acyl group is usually about 2 to 20, preferably about 2 to 18, and more preferably about 2 to 16. The acyl group includes, for example, an acetyl group, a propionyl group, a butyryl group, an isobutyryl group, a pivaloyl group, a benzoyl group, a trifluoroacetyl group, and a pentafluorobenzoyl group.

An acyloxy group means an unsubstituted acyloxy group and an acyloxy group substituted with a halogen atom or the like. The number of the carbon atoms of the acyloxy group is usually about 2 to 20, preferably about 2 to 18, and more preferably about 2 to 16. The acyloxy group includes, for example, an acetoxy group, a propionyloxy group, a butyryloxy group, an isobutyryloxy group, a pivaloyloxy group, a benzoyloxy group, a trifluoroacetyloxy group, and a pentafluorobenzoyloxy group.

An imine residue means a residue obtained by removing, from an imine compound having a structure represented by at least one of the formula: H—N=C< and the formula: —N=CH—, one hydrogen atom in this structure. Such an imine compound includes, for example, aldimine, ketimine, and a compound in which the hydrogen atom bonded to the nitrogen atom in aldimine is substituted with an alkyl group, an aryl group, an arylalkyl group, an arylalkenyl group, an arylalkynyl group, or the like. The number of the carbon atoms of the imine residue is usually about 2 to 20, preferably about 2 to 18, and more preferably about 2 to 16. The imine residue includes, for example, a group represented by the general formula: —CR''=N—R''' or the general formula: —N=C(R''')$_2$ wherein R'' represents a hydrogen atom, an alkyl group, an aryl group, an arylalkyl group, an arylalkenyl group, or an arylalkynyl group, and R''' independently represents an alkyl group, an aryl group, an arylalkyl group, an arylalkenyl group, or an arylalkynyl group, provided that when two R'''s are present, the two R'''s may be bonded to each other and taken together to form a ring as a divalent group, for example, an alkylene group having 2 to 18 carbon atoms, such as an ethylene group, a trimethylene group, a tetramethylene group, a pentamethylene group, and a hexamethylene group. Specific examples of the imine residue include groups represented by the following structural formulas:

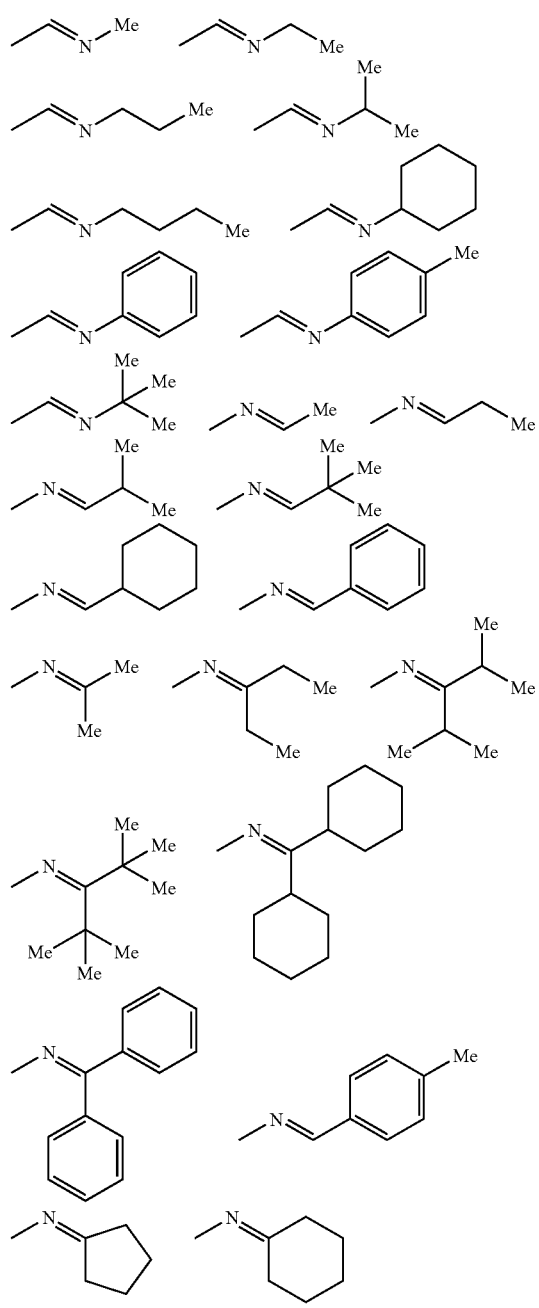

wherein Me represents a methyl group.

An amide group means an unsubstituted amide group and an amide group substituted with a halogen atom or the like. The number of the carbon atoms of the amide group is usually about 2 to 20, preferably about 2 to 18, and more preferably about 2 to 16. As the amide group, for example, a formamide group, an acetamide group, a propioamide group, a butyroamide group, a benzamide group, a trifluoroacetamide group, a pentafluorobenzamide group, a diformamide group, a diacetamide group, a dipropioamide group, a dibutyroamide group, a dibenzamide group, a ditrifluoroacetamide group, and a dipentafluorobenzamide group are illustrated.

An acid imide group means a residue obtained by removing the hydrogen atom bonded to the nitrogen atom from acid imide. The number of the carbon atoms of the acid imide group is usually about 4 to 20, preferably about 4 to 18, and more preferably about 4 to 16. The acid imide group includes, for example, groups shown below:

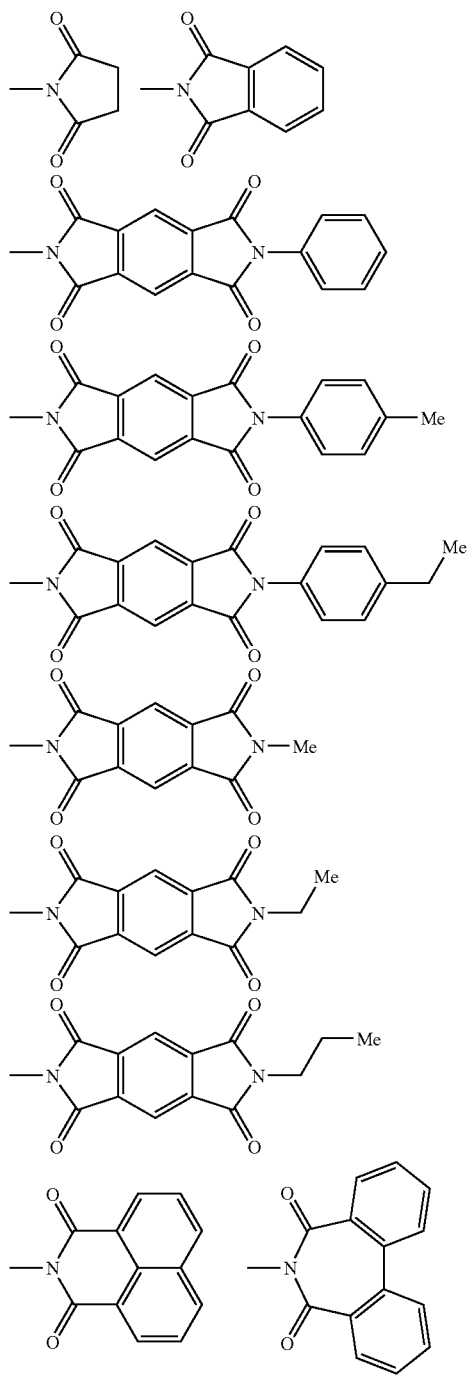

wherein Me represents a methyl group.

A carboxyl group means an unsubstituted carboxyl group and a carboxyl group substituted with a substituent, such as an alkyl group, an aryl group, an arylalkyl group, and a monovalent heterocyclic group (hereinafter referred to as a substituted carboxyl group). The substituent may have a secondary substituent. The number of the carbon atoms of the substituted carboxyl group is usually about 1 to 60, preferably about 2 to 48, and more preferably about 2 to 45, not including the number of the carbon atoms of the secondary substituent. The substituted carboxyl group includes, for example, a methoxycarbonyl group, an ethoxycarbonyl group, a propoxycarbonyl group, an isopropoxycarbonyl group, a butoxycarbonyl group, an isobutoxycarbonyl group, an s-butoxycarbonyl group, a t-butoxycarbonyl group, a pentyloxycarbonyl group, a hexyloxycarbonyl group, a cyclohexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, a dodecyloxycarbonyl group, a trifluoromethoxycarbonyl group, a pentafluoroethoxycarbonyl group, a perfluorobutoxycarbonyl group, a perfluorohexyloxycarbonyl group, a perfluorooctyloxycarbonyl group, a phenoxycarbonyl group, a naphthoxycarbonyl group, and a pyridyloxycarbonyl group.

<Repeating Unit Represented by Formula (I)>

The block copolymer of the present invention comprises two or more different types of repeating units represented by the following formula (I) in the block (A). The block copolymer of the present invention may comprise three or more different types of repeating units represented by the following formula (I) in the block (A).

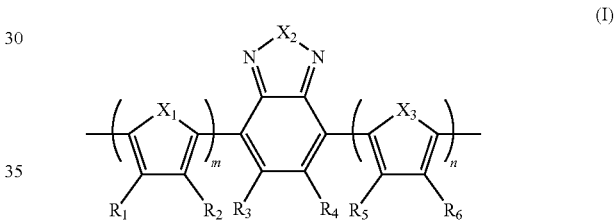

(I)

wherein $R_1$, $R_2$, $R_3$, $R_4$, $R_5$, and $R_6$ independently represent a hydrogen atom, a halogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a cyano group, or a nitro group, m and n independently represent an integer of 1 to 3, and $X_1$, $X_2$, and $X_3$ independently represent an oxygen atom, a sulfur atom, or $-C(R_7)=C(R_8)-$ wherein $R_7$ and $R_8$ independently represent a hydrogen atom, a halogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a cyano group, or a nitro group, provided that when a plurality of at least one of $R_1$, $R_2$, $R_5$, $R_6$, $X_1$, and $X_3$ are present, the plurality of atoms or groups may be the same or different.

From the viewpoint of the ease of the synthesis of the raw material monomer, in the above formula (I), $R_1$, $R_2$, $R_3$, $R_4$, $R_5$, and $R_6$ are preferably independently a hydrogen atom, an alkyl group, an alkoxy group, an alkylthio group, an aryl group, an aryloxy group, an arylthio group, or a heterocyclic thio group, more preferably a hydrogen atom, an alkyl group, an alkoxy group, an aryl group, or an aryloxy group, and further preferably a hydrogen atom, an alkyl group, or an aryl group.

From the viewpoint of the ease of the synthesis of the raw material monomer, in the above formula (I), m and n are preferably independently 1 or 2.

Further, from the viewpoint of the durability of the block copolymer of the present invention, in the above formula (I), $X_1$, $X_2$, and $X_3$ are preferably an oxygen atom or a sulfur atom, and further preferably a sulfur atom.

Two or more types of repeating units represented by the above formula (I) being different means that between any two types of repeating units selected from the two or more types of repeating units, at least one of $R_1$, $R_2$, $R_3$, $R_4$, $R_5$, $R_6$, $X_1$, $X_2$, $X_3$, m, and n in the above formula (I) is different from each other. From the viewpoint of the luminous efficiency of the obtained light-emitting device, preferably, at least one of $R_1$, $R_2$, $R_3$, $R_4$, $R_5$, and $R_6$ is different from each other.

Specific examples of the repeating unit represented by the above formula (I) include repeating units represented by the following formulas (I-1) to (I-8):

(I-1)

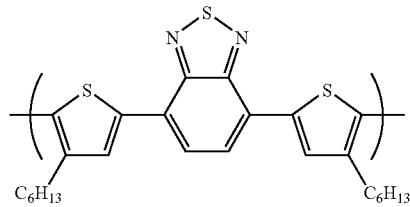

(I-2)

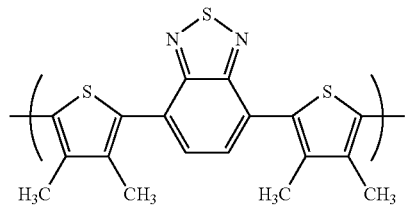

(I-3)

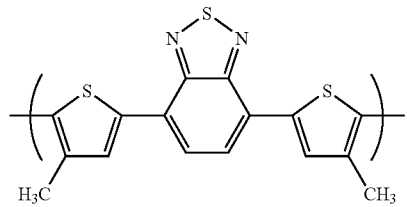

(I-4)

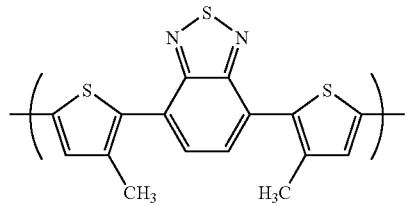

(I-5)

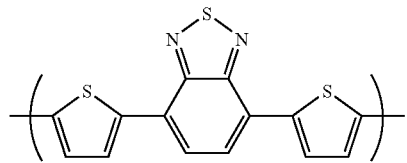

(I-6)

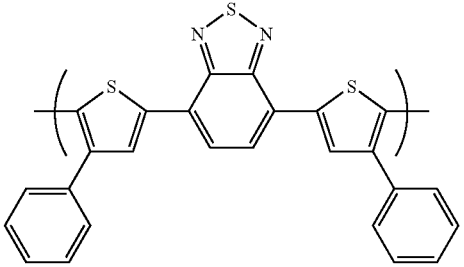

(I-7)

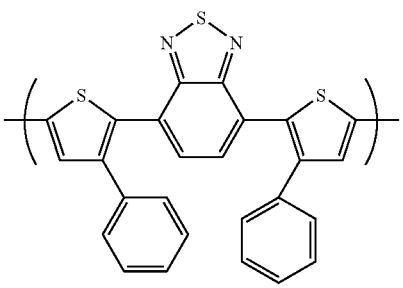

(I-8)

Specific examples of combinations of two or more different types of repeating units represented by the above formula (I) include (I-1) and (I-5), (I-3) and (I-5), (I-4) and (I-5), (I-6) and (I-5), (I-1) and (I-3), (I-1) and (I-6), (I-3) and (I-6), and (I-4) and (I-7).

<Repeating Unit Represented by Formula (II)>

The block copolymer of the present invention has a repeating unit represented by the following formula (II), in addition to the repeating unit represented by the above formula (I), in the block (A). Also, the block copolymer of the present invention has the repeating unit represented by the following formula (II) in the block (B). The block copolymer of the present invention may have two or more different types of repeating units represented by the following formula (II) in either of the blocks (A) and (B).

$$—Ar_1—\qquad (II)$$

wherein $Ar_1$ represents an arylene group.

The arylene group is a remaining atomic group obtained by removing from an aromatic hydrocarbon two hydrogen atoms bonded to carbon atoms constituting an aromatic ring and means an unsubstituted arylene group and a substituted arylene group. The arylene group also includes one having a condensed ring, and one in which two or more independent benzene rings or condensed rings are bonded via a single bond or a divalent organic group, for example, an alkenylene group, such as a vinylene group. The substituted atom and substituent in the substituted arylene group are not particularly limited. However, from the viewpoint of solubility, fluorescence characteristics, the ease of synthesis, characteristics as a material of a device, and the like, a halogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a cyano group, or a nitro group is preferred.

The number of the carbon atoms of a portion excluding the substituent in the arylene group is usually about 6 to 60, preferably about 6 to 20, and more preferably about 6 to 18. Also, the total number of the carbon atoms of the arylene group including the substituent is usually about 6 to 100, preferably about 6 to 80, and more preferably about 6 to 70.

The arylene group includes, for example, a phenylene group (for example, the following formulas 1 to 3), a naphthalenediyl group (for example, the following formulas 4 to 13), an anthracene-diyl group (for example, the following formulas 14 to 19), a biphenyl-diyl group (for example, the following formulas 20 to 25), a terphenyl-diyl group (for example, the following formulas 26 to 28), a fluorene-diyl group (for example, the following formulas 36 to 38), a benzofluorene-diyl group (for example, the following formulas 39 to 46), and other divalent condensed polycyclic aromatic hydrocarbon groups (for example, the following formulas 29 to 35).

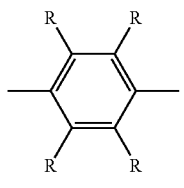

1

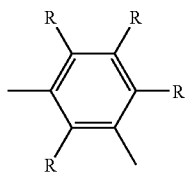

2

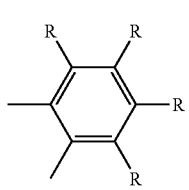

3

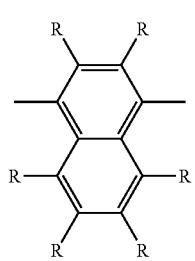

4

-continued

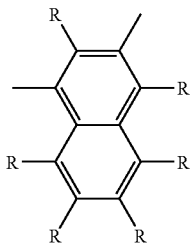

5

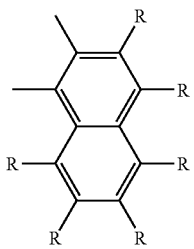

6

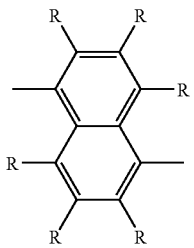

7

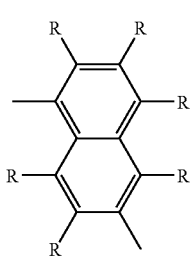

8

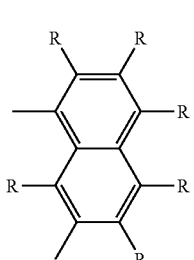

9

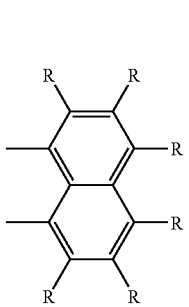

10

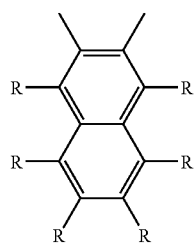
11
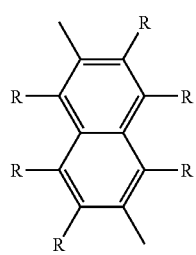
12
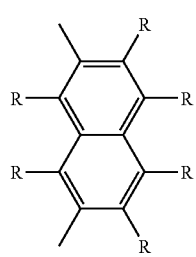
13
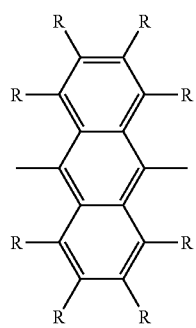
14
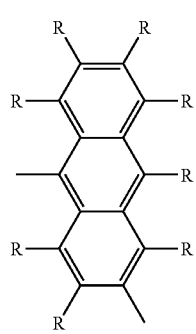
15
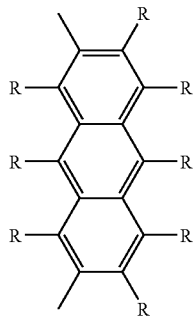
16
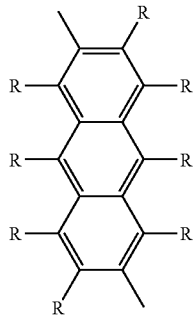
17
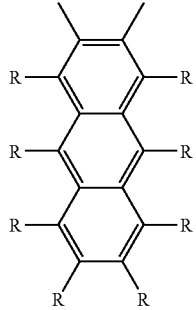
18
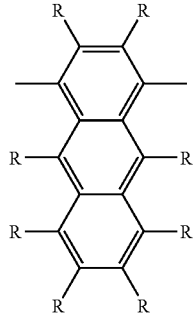
19
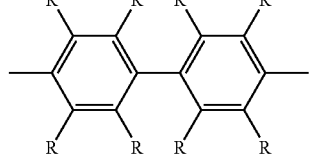
20
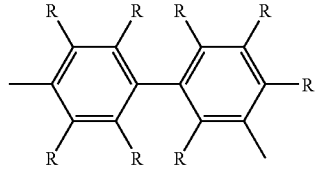
21

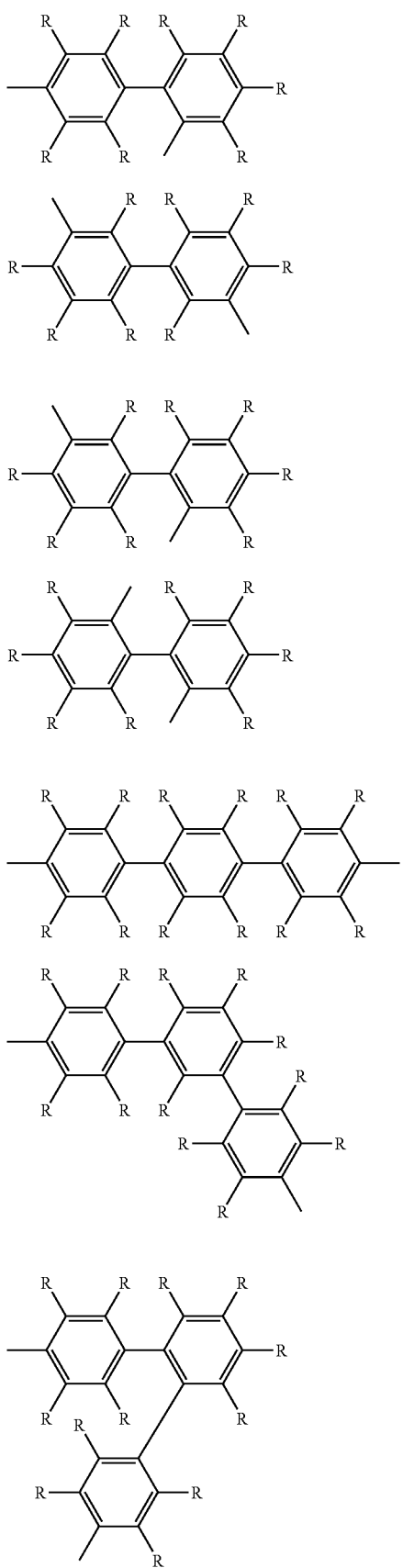
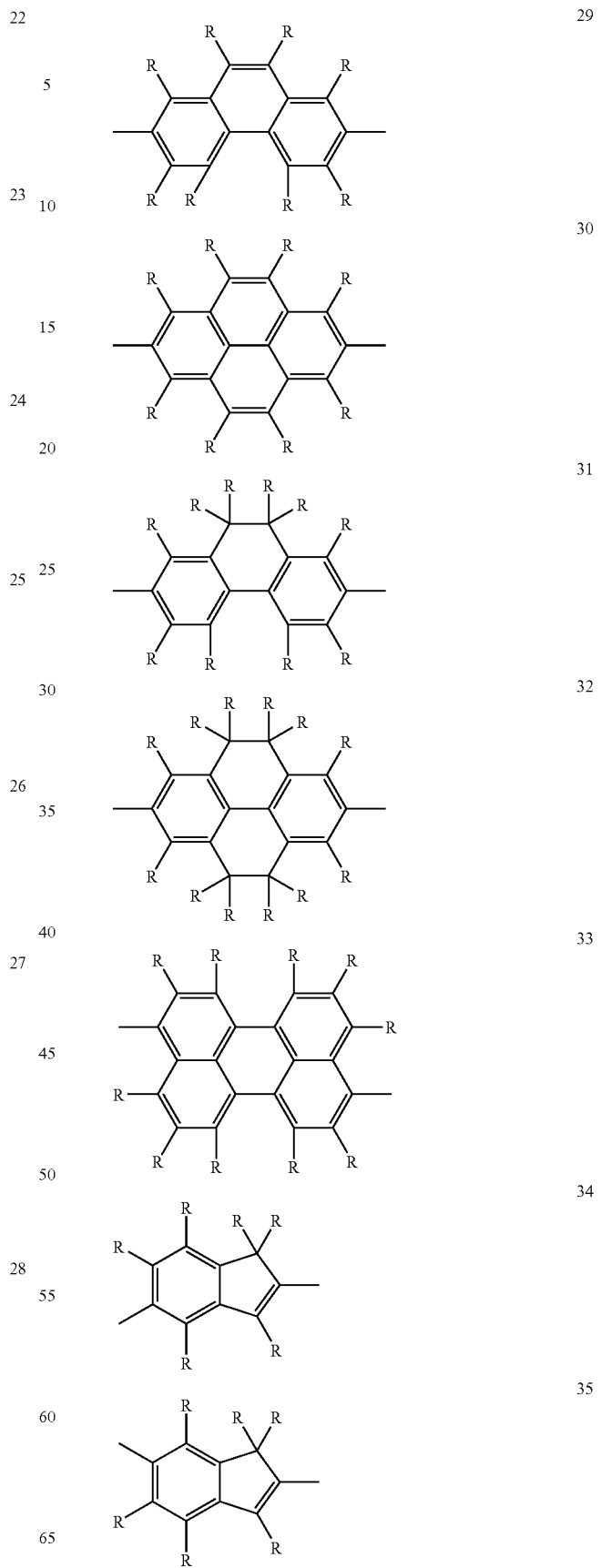

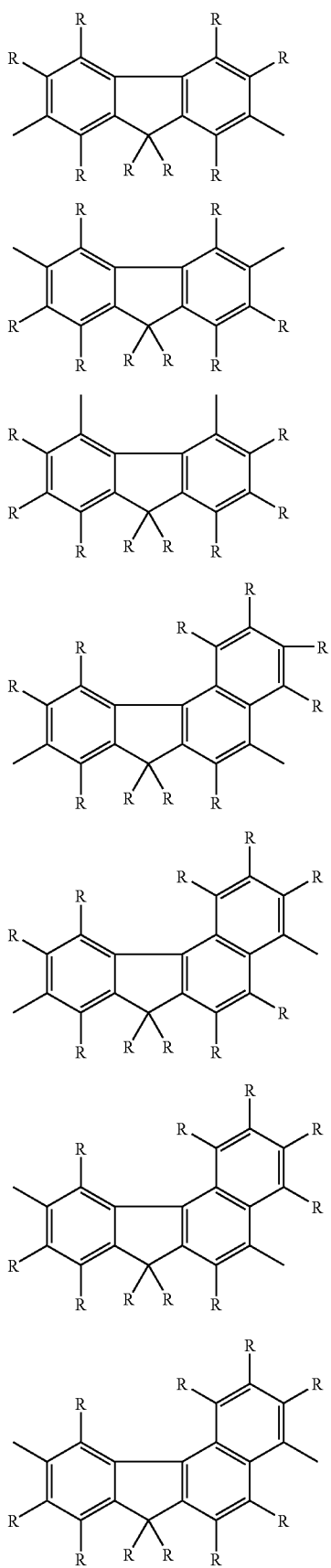

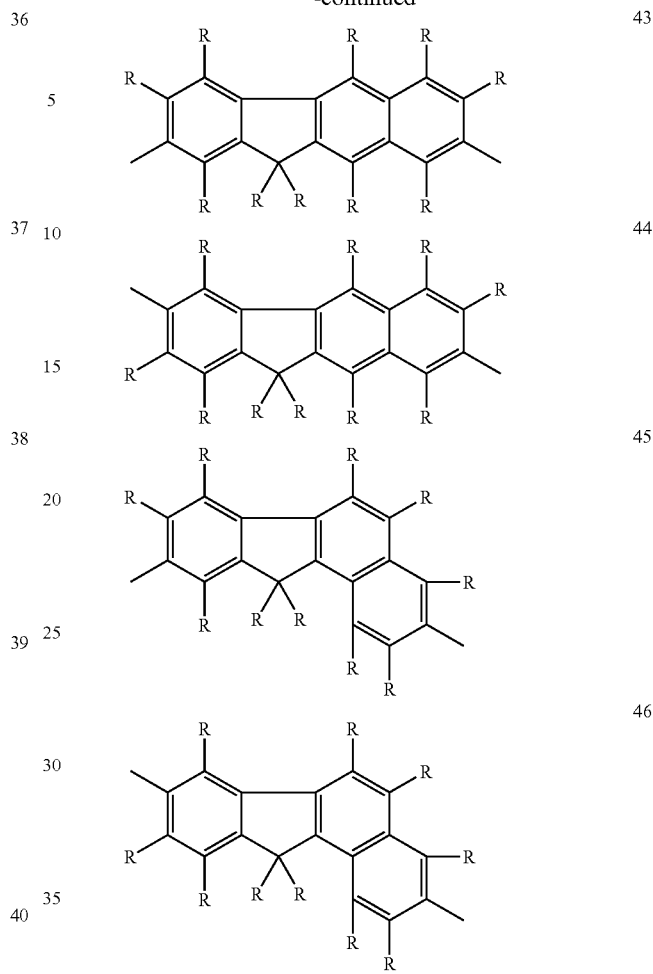

In the above formulas 1 to 46, R represents a hydrogen atom, a halogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a cyano group, or a nitro group.

From the viewpoint of the durability of a light-emitting device using the block copolymer of the present invention, in the above formula (II), $Ar_1$ is preferably a group represented by the following formula (IV):

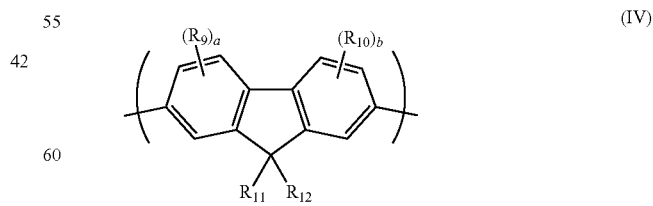

wherein $R_9$ and $R_{10}$ independently represent a halogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a cyano group, or a nitro group, and a and b independently represent an integer of 0 to 3, provided that when a plurality of at least one of $R_9$ and $R_{10}$ are present, the plurality of atoms or groups may be the same or different, and $R_{11}$ and $R_{12}$ independently represent a hydrogen atom, a halogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a cyano group, or a nitro group.

From the viewpoint of the durability of a light-emitting device using the block copolymer of the present invention, in the above formula (IV), $R_9$ and $R_{10}$ are preferably an aryl group or an alkyl group From the viewpoint of the ease of the synthesis of the raw material monomer, in the above formula (IV), a and b are preferably 0 or 1, and most preferably 0.

From the viewpoint of the ease of the synthesis of the raw material monomer, in the above formula (IV), $R_{11}$ and $R_{12}$ are preferably an alkyl group or an aryl group.

Specific examples of the group represented by the above formula (IV) include groups represented by the following formulas (IV-1) to (IV-8):

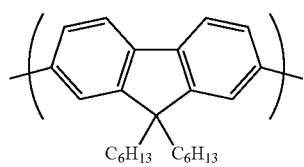
(IV-1)

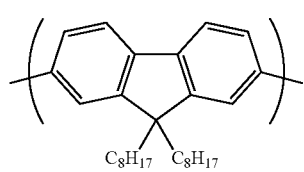
(IV-2)

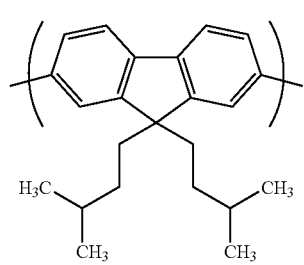
(IV-3)

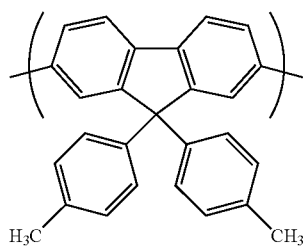
(IV-4)

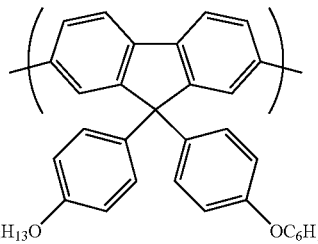
(IV-5)

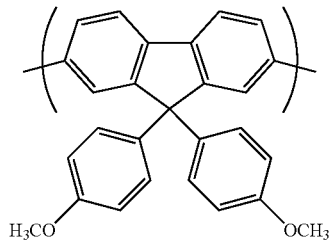
(IV-6)

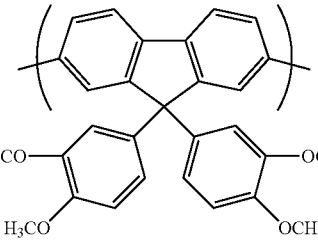
(IV-7)

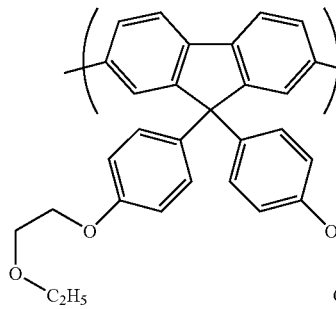
(IV-8)

<Repeating Unit Represented by Formula (III)>

The block copolymer of the present invention has a repeating unit represented by the following formula (III), in addition to the repeating unit represented by the above formula (II), in the block (B). The block copolymer of the present invention may have two or more different types of repeating units represented by the following formula (III) in the block (B).

$$—Ar_2—  \quad (III)$$

wherein $Ar_2$ represents a divalent aromatic amine residue.

The divalent aromatic amine residue refers to a remaining atomic group obtained by removing from aromatic amine two hydrogen atoms bonded to carbon atoms constituting an aromatic ring and means an unsubstituted divalent aromatic amine residue and a substituted divalent aromatic amine residue. The substituted atom and substituent in the substituted divalent aromatic amine residue are not particularly limited. Examples of the substituted atom and substituent include a halogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a cyano group, or a nitro group. The number of the carbon atoms of the divalent aromatic amine residue is usually about 5 to 100, preferably about 15 to 80, and more preferably about 15 to 60, not including the number of the carbon atoms of the substituent.

The divalent aromatic amine residue includes, for example, groups represented by the following formulas 401 to 410.

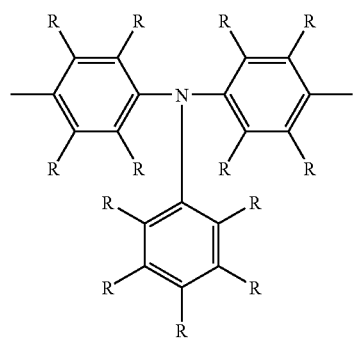

401

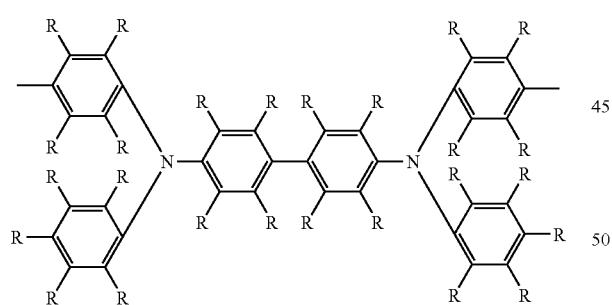

402

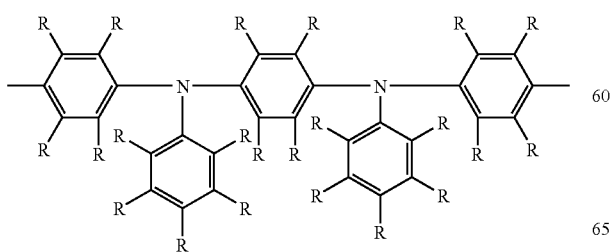

403

-continued

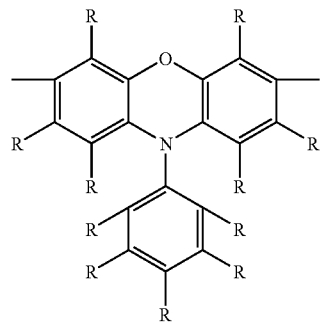

404

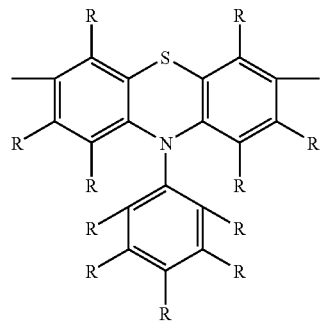

405

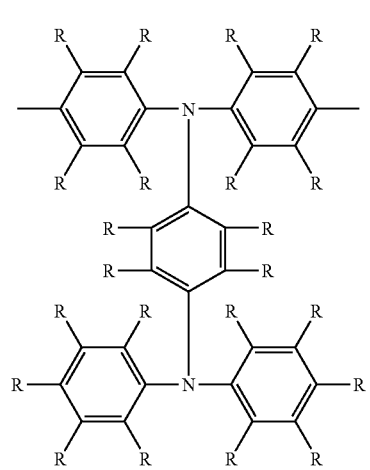

406

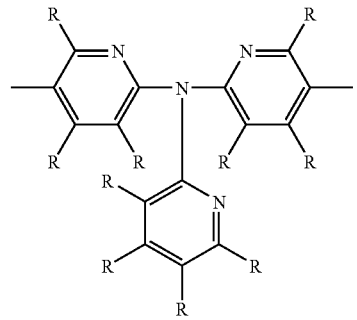

407

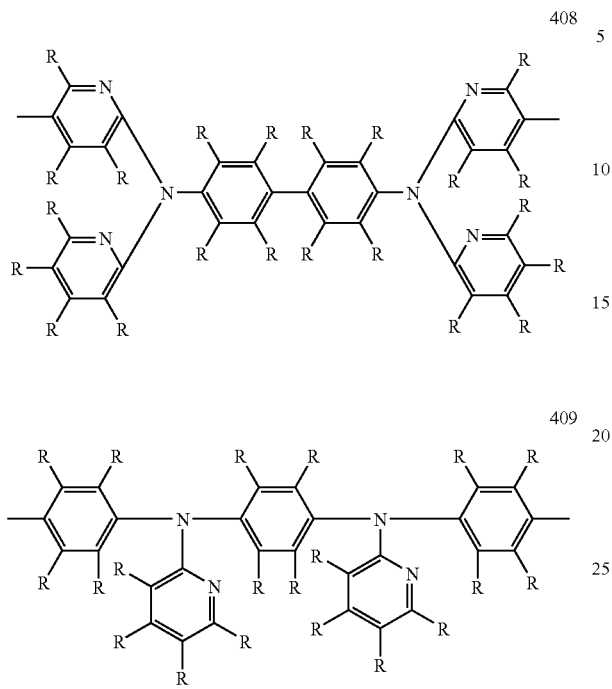
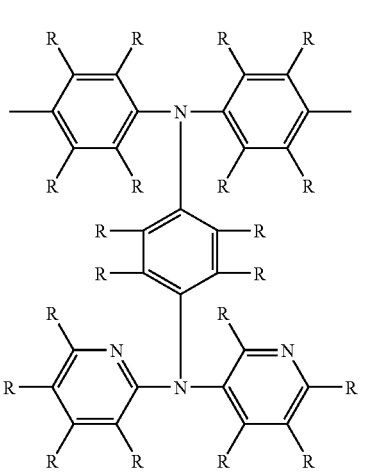
In the above formulas 401 to 410, R represents the same meaning as the above.
From the viewpoint of providing a device in which 10% luminance reduction life is long, in the above formula (III), $Ar_2$ is preferably a group represented by the following formula (V).
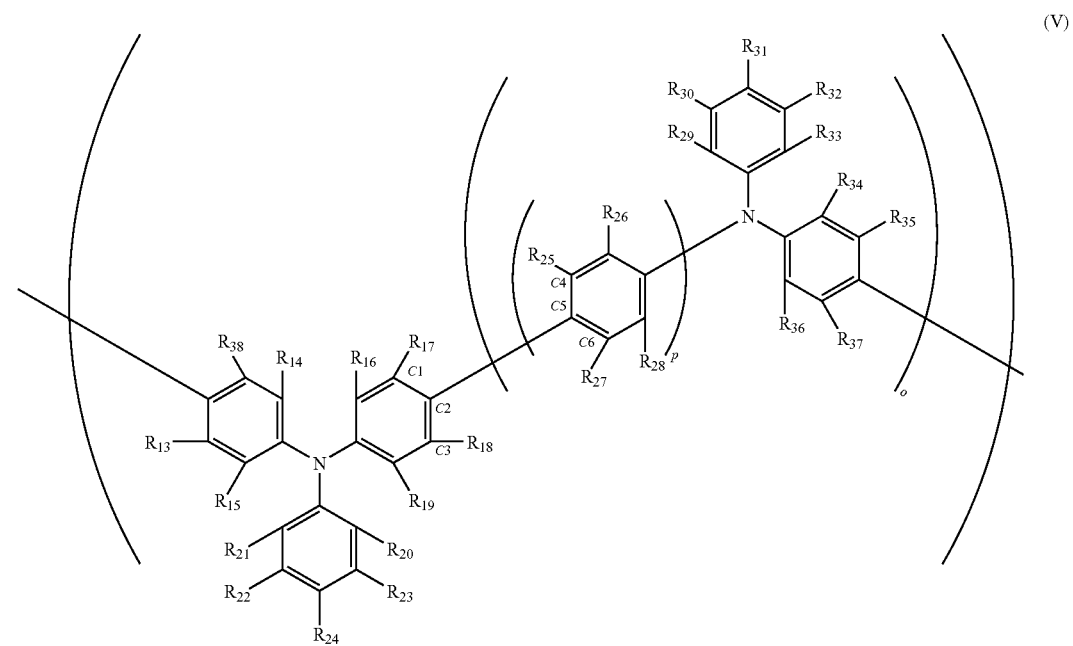

wherein $R_{13}$ to $R_{38}$ independently represent a hydrogen atom, a halogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a cyano group, or a nitro group, and o and p independently represent 0 or 1, C1 to C6 each represent the position of a carbon atom, provided that at least one of combinations of $R_{14}$ and $R_{16}$, $R_{15}$ and $R_{21}$, $R_{28}$ and $R_{36}$, and $R_{33}$ and $R_{34}$ may be taken together to form a single bond or a divalent group represented by the formula: —O— or the formula: —S—, instead of representing the above atom or group, a combination of $R_{17}$ and $R_{25}$ may be taken together to form a single bond or a divalent group to form a ring with carbon atoms at the C1 position, the C2 position, the C4 position, and the C5 position, instead of representing the above atom or group, and a combination of $R_{18}$ and $R_{27}$ may be taken together to form a single bond or a divalent group to form a ring with carbon atoms at the C2 position, the C3 position, the C5 position, and the C6 position, instead of representing the above atom or group.

When the combination of $R_{17}$ and $R_{25}$ is taken together to form a divalent group, instead of representing the above atom or group, and when the combination of $R_{18}$ and $R_{27}$ is taken together to form a divalent group, instead of representing the above atom or group, the divalent group includes, for example, an unsubstituted or substituted $C_1$ to $C_6$ alkylene group, such as a methylene group, a dimethylene group, a trimethylene group, a tetramethylene group, a pentamethylene group, and a hexamethylene group; an unsubstituted or substituted $C_1$ to $C_6$ alkenylene group, such as a vinylene group, a propenylene group, a butenylene group, a pentenylene group, and a hexenylene group; an unsubstituted or substituted $C_6$ to $C_{10}$ arylene group, such as a phenylene group and a naphthalenediyl group; a divalent group represented by the formula: —X'— wherein X' is, for example, an oxygen atom, a sulfur atom, or N=CR wherein R represents the same meaning as the above, such as a divalent group represented by the formula: —O—, the formula: —S—, or the formula: —N=CR— wherein R represents the same meaning as the above; and an unsubstituted or substituted $C_3$ to $C_{10}$ divalent heterocyclic group, such as a divalent group represented by the following formula:

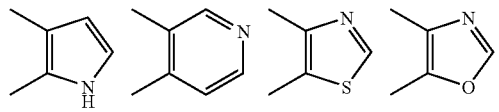

Here, the divalent heterocyclic group refers to a remaining atomic group obtained by removing two hydrogen atoms from a heterocyclic compound. When the above divalent group is substituted, the substituted atom includes, for example, a halogen atom, and the substituent includes, for example, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a cyano group, and a nitro group.

When the combination of $R_{17}$ and $R_{25}$ is taken together to form a single bond or a divalent group to form a ring with carbon atoms at the C1 position, the C2 position, the C4 position, and the C5 position, instead of representing the above atom or group, and when the combination of $R_{18}$ and $R_{27}$ is taken together to form a single bond or a divalent group to form a ring with carbon atoms at the C2 position, the C3 position, the C5 position, and the C6 position, instead of representing the above atom or group, the ring includes, for example, an unsubstituted or substituted $C_4$ to $C_{10}$ cycloalkane ring, an unsubstituted or substituted $C_4$ to $C_{10}$ cycloalkene ring, an unsubstituted or substituted $C_6$ to $C_{14}$ aromatic hydrocarbon ring, or an unsubstituted or substituted $C_4$ to $C_{14}$ heterocycle. When these rings are substituted, the substituted atom includes, for example, a halogen atom, and the substituent includes, for example, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a cyano group, and a nitro group.

The cycloalkane ring includes, for example, a cyclobutane ring, a cyclopentane ring, a cyclohexane ring, a cycloheptane ring, a cyclooctane ring, a cyclononane ring, and a cyclodecane ring.

The cycloalkene ring includes one having two or more double bonds, and its specific examples include a cyclohexene ring, a cyclohexadiene ring, and a cyclooctatriene ring.

The aromatic hydrocarbon ring includes, for example, a benzene ring, a naphthalene ring, and an anthracene ring.

As the heterocycle, for example, a furan ring, a tetrahydrofuran ring, a thiophene ring, a tetrahydrothiophene ring, an indole ring, a tetrahydroindole ring, an isoquinoline ring, a pyridine ring, a thiazole ring, and an oxazole ring are illustrated.

From the viewpoint of the ease of the synthesis of the raw material monomer, $R_{13}$ to $R_{38}$ are preferably independently a hydrogen atom, an alkyl group, an alkoxy group, an alkylthio group, an aryl group, an aryloxy group, an arylthio group, or a heterocyclic thio group, more preferably a hydrogen atom, an alkyl group, an alkoxy group, an aryl group, or an aryloxy group, and further preferably a hydrogen atom, an alkyl group, or an alkoxy group.

From the viewpoint of the ease of the synthesis of the raw material monomer, when at least one of combinations of $R_{14}$ and $R_{16}$, and $R_{28}$ and $R_{36}$ is taken together to form a single bond or a divalent group represented by the formula: —O— or the formula: —S—, instead of representing the above atom or group, the at least one combination preferably forms a divalent group represented by the formula: —O— or the formula: —S—, and further preferably a group represented by the formula: —O—.

From the viewpoint of the ease of the synthesis of the raw material monomer, when at least one of combinations of $R_{15}$ and $R_{21}$, and $R_{33}$ and $R_{34}$ is taken together to form a single bond or a divalent group represented by the formula: —O— or the formula: —S—, instead of representing the above atom or group, the at least one combination preferably forms a single bond.

From the viewpoint of the ease of the synthesis of the raw material monomer, when the combination of $R_{17}$ and $R_{25}$ is taken together to form a single bond or a divalent group to form a ring with carbon atoms at the C1 position, the C2 position, the C4 position, and the C5 position, instead of representing the above atom or group, and when the combination of $R_{18}$ and $R_{27}$ is taken together to form a single bond or a divalent group to form a ring with carbon atoms at the C2 position, the C3 position, the C5 position, and the C6 position, instead of representing the above atom or group, the ring is preferably a cycloalkane ring or an aromatic hydrocarbon ring.

Specific examples of the group represented by the above formula (V) include groups represented by the following formulas (V-1) to (V-19):

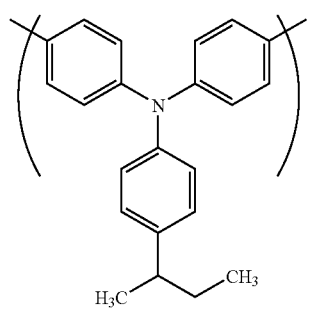
(V-1)

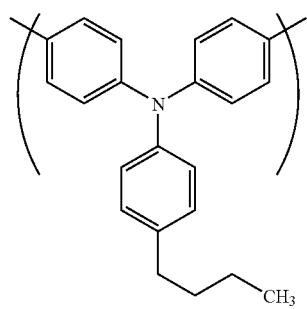
(V-2)

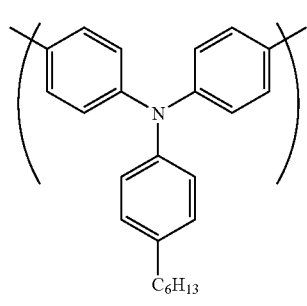
(V-3)

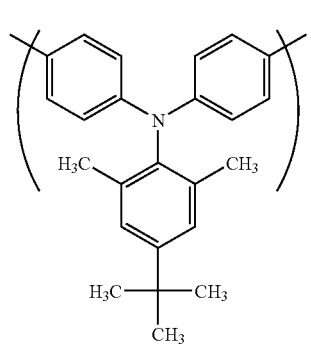
(V-4)

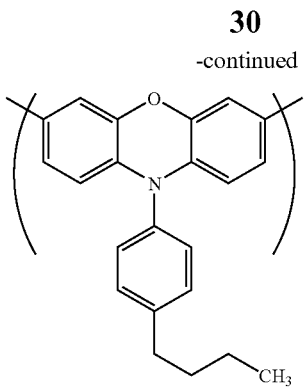
(V-5)

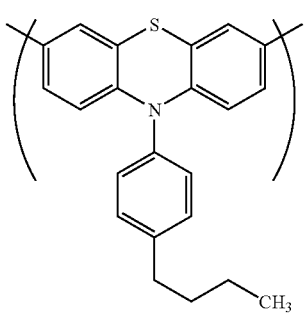
(V-6)

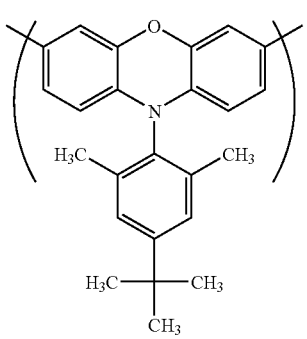
(V-7)

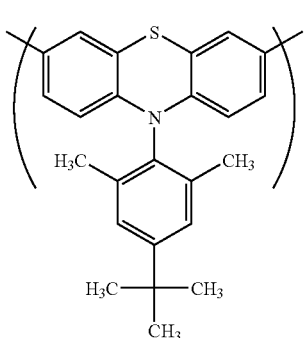
(V-8)

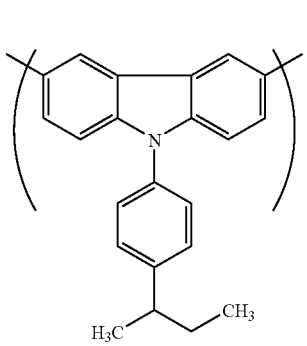
(V-9)

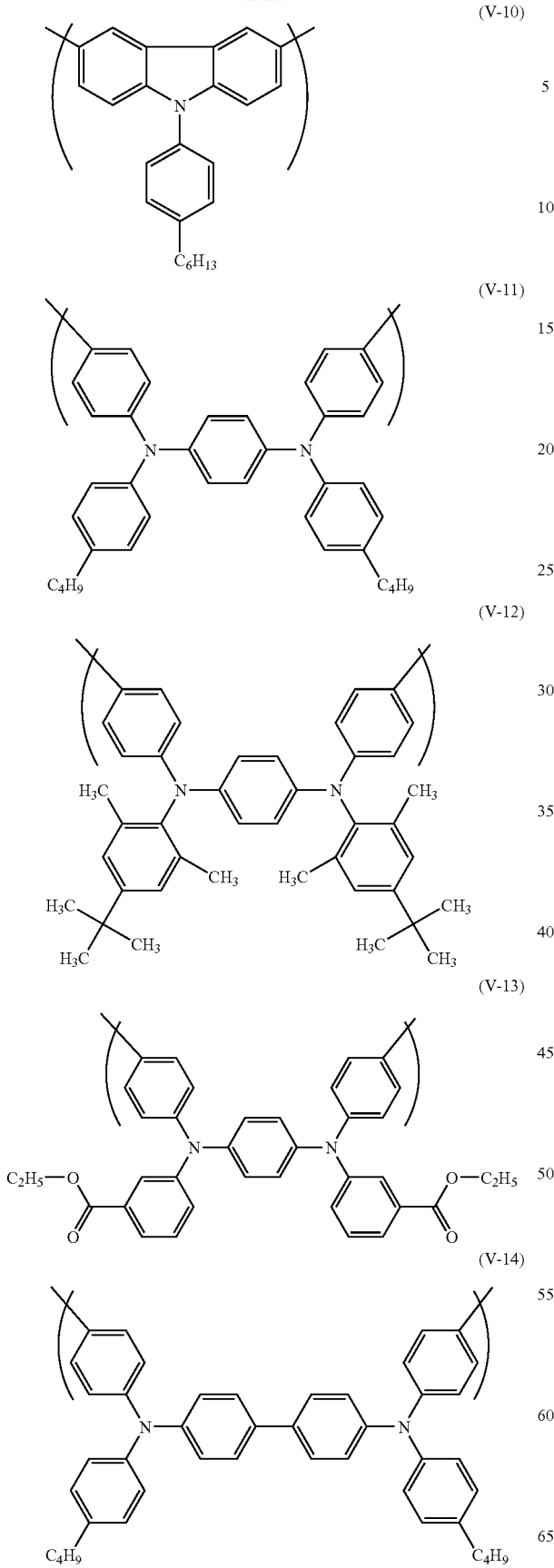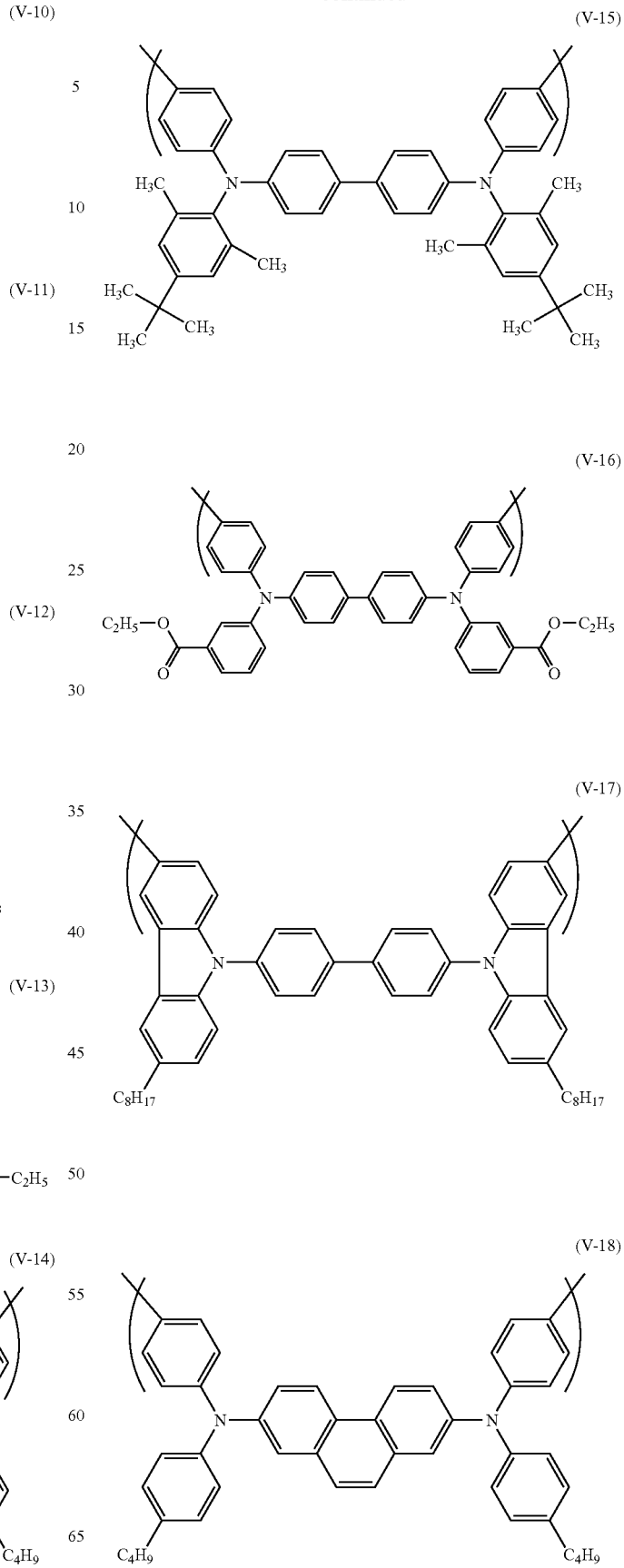

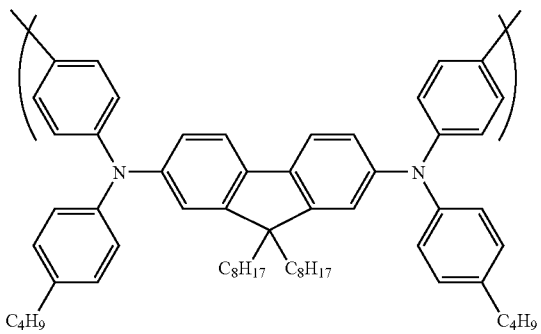

(V-19)

<Other Repeating Units>

Further, the block copolymer of the present invention is preferably a copolymer comprising a repeating unit other than the repeating units represented by the above formulas (I) to (III) in either of the block (A) and the block (B), from the viewpoint of changing the charge transport property, improving heat resistance, and the like. As the repeating unit other than the repeating units represented by the above formulas (I) to (III), a repeating unit represented by the following formula (C) is preferred.

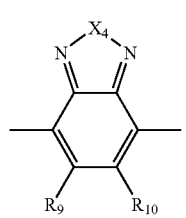

(C)

wherein $R_9$ and $R_{10}$ independently represent a hydrogen atom, a halogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a cyano group, or a nitro group, and $X_4$ represents an oxygen atom, a sulfur atom, or —C($R_7$)=C($R_8$)— wherein $R_7$ and $R_8$ represent the same meaning as the above.

From the viewpoint of the ease of the synthesis of the raw material monomer, in the above formula (C), $R_9$ and $R_{10}$ are preferably independently a hydrogen atom, an alkyl group, an alkoxy group, an alkylthio group, an aryl group, an aryloxy group, an arylthio group, or a heterocyclic thio group, more preferably a hydrogen atom, an alkyl group, an alkoxy group, an aryl group, or an aryloxy group, and further preferably a hydrogen atom, an alkyl group, or an aryl group.

Further, from the viewpoint of the durability of the block copolymer of the present invention, in the above formula (C), $X_4$ is preferably an oxygen atom or a sulfur atom, and more preferably a sulfur atom.

<Block Copolymer>

With respect to all repeating units in the block copolymer, the content of the total of two or more different types of repeating units represented by the above formula (I) is usually in the range of 0.02 mol % to 50 mol %, the content of the repeating unit represented by the above formula (II) is usually in the range of 10 mol % to 90 mol %, and the content of the repeating unit represented by the above formula (III) is usually in the range of 0.1 mol % to 60 mol %. Also, when the block copolymer of the present invention comprises a repeating unit other than the repeating units represented by the above formulas (I) to (III), for example, the repeating unit represented by the above formula (C), the content of such a repeating unit is usually in the range of 1 mol % to 50 mol % with respect to all repeating units in the block copolymer.

From the viewpoint of providing a light-emitting device with long life when using the block copolymer of the present invention as the light-emitting material of the light-emitting device, the content of the total of two or more different types of repeating units represented by the above formula (I) is preferably 3 mol % or more and 40 mol % or less, and preferably 5 mol % or more and 30 mol % or less, with respect to all repeating units in the block copolymer.

The block copolymer of the present invention preferably has a polystyrene equivalent number average molecular weight of $1\times10^3$ to $1\times10^7$, and further preferably $1\times10^4$ to $1\times10^7$, from the viewpoint of the life characteristics of the device.

The block copolymer of the present invention preferably has a polystyrene equivalent weight average molecular weight of $1\times10^3$ to $1\times10^7$, and further preferably $1\times10^4$ to $1\times10^7$, from the viewpoint of the life characteristics of the device.

In the block copolymer of the present invention, the block (A) preferably has a polystyrene equivalent number average molecular weight of $1\times10^3$ to $1\times10^5$, and more preferably $1\times10^4$ to $1\times10^5$, from the viewpoint of the life characteristics of the device.

In the block copolymer of the present invention, the block (A) preferably has a polystyrene equivalent weight average molecular weight of $1\times10^3$ to $1\times10^5$, and more preferably $1\times10^4$ to $1\times10^5$, from the viewpoint of the life characteristics of the device.

In the present invention, the number average molecular weight and weight average molecular weight based on polystyrene standards are obtained by a size exclusion chromatograph (SEC) (LC-10Avp manufactured by SHIMADZU CORPORATION). The block copolymer to be measured is dissolved in tetrahydrofuran at a concentration of about 0.5 wt %, and 50 µL of the solution is injected into the SEC. Tetrahydrofuran is used as the mobile phase of the SEC and flowed at a flow rate of 0.6 mL/min. As the column, two of TSKgel SuperHM-H (manufactured by TOSOH CORPORATION) and one of TSKgel SuperH2000 (manufactured by TOSOH CORPORATION) are used, connected in series. For the detector, a differential refractive index detector (RID-10A manufactured by SHIMADZU CORPORATION) is used.

When with respect to the total of the blocks (A) and (B), the mole fraction of the block (A) is represented as [A], and the mole fraction of the block (B) is represented as [B], [A]/[B] is preferably 0.1 or more and 10 or less, and more preferably 0.5 or more and 8 or less, from the viewpoint of the life characteristics of the device.

Also, if a substituent involved in condensation polymerization remains as it is at the end of the block copolymer of the present invention, the emission characteristics and life when a device is formed may decrease, therefore, the end of the block copolymer may be protected by a stable protective group. As the protective group, one having a conjugated bond continuous with the conjugated structure of the main chain is preferred, and the protective group includes, for example, one bonded to an aryl group or a heterocyclic group via a carbon-carbon bond. Specifically, substituents described in Formula 10 in JP-A-9-45478, and the like are illustrated.

As the good solvent for the block copolymer of the present invention, chloroform, methylene chloride, dichloroethane, tetrahydrofuran, toluene, xylene, mesitylene, tetralin, decalin, n-butylbenzene, and the like are illustrated. Although depending on the structure and molecular weight of the block copolymer, usually, 0.1% or more by weight of the block copolymer can be dissolved in these solvents.

<Method for Manufacturing Block Copolymer>

Next, a method for manufacturing the block copolymer of the present invention will be described.

The method for synthesizing the block polymer includes, for example, a method in which the block (A) having a high molecular weight is synthesized and a monomer constituting the block (B) is added to the block (A) for polymerization, and a method in which the block (A) having a high molecular weight and the block (B) having a high molecular weight are previously synthesized and these are polymerized together.

For example, the block copolymer of the present invention can be manufactured by using a compound represented by $Y_1$-A-$Y_2$, a compound represented by $Y_1$—$Ar_1$—$Y_2$, and a compound represented by $Y_1$—$Ar_2$—$Y_2$, as raw materials, and subjecting these to condensation polymerization, wherein -A- represents the repeating unit represented by the above formula (I), $Ar_1$ and $Ar_2$ represent the same meaning as the above, and $Y_1$ and $Y_2$ each independently represent a substituent involved in condensation polymerization.

Also, when the block copolymer of the present invention has a repeating unit other than the repeating units represented by the above formulas (I) to (III), a compound having two substituents involved in condensation polymerization and providing the repeating unit other than the repeating units represented by the above formulas (I) to (III) after polymerization should be coexisted for condensation polymerization. Examples of such a compound include a compound represented by the following formula (D). This compound has two substituents involved in condensation polymerization and provides a repeating unit represented by the above formula (C) after polymerization.

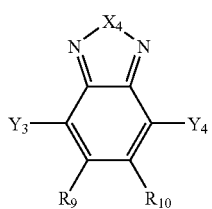

(D)

wherein $R_9$, $R_{10}$, and $X_4$ represent the same meaning as the above, $Y_3$ and $Y_4$ represent a substituent involved in condensation polymerization.

In the manufacturing method of the present invention, the substituents ($Y_1$, $Y_2$, $Y_3$, and $Y_4$) involved in condensation polymerization include a halogen atom, an alkylsulfo group, an arylsulfo group, an arylalkylsulfo group, a borate group, a sulfonium methyl group, a phosphonate methyl group, a phosphonate methyl group, a methyl monohalide group, a —B(OH)$_2$, a formyl group, a cyano group, or a vinyl group.

As the alkylsulfo group, a methanesulfo group, an ethanesulfo group, a trifluoromethanesulfo group, and the like are illustrated. As the arylsulfo group, a benzenesulfo group, a p-toluenesulfo group, and the like are illustrated. As the arylalkylsulfo group, a benzylsulfo group and the like are illustrated.

As the borate group, groups represented by the following formulas are illustrated:

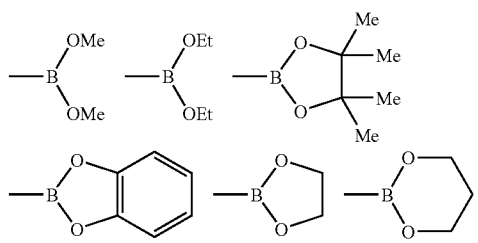

wherein Me represents a methyl group, and Et represents an ethyl group.

As the sulfonium methyl group, groups represented by the following formulas are illustrated:

$$-CH_2S^+Me_2X^-, -CH_2S^+Ph_2X^-$$

wherein X represents a halogen atom, Me represents a methyl group, and Ph represents a phenyl group.

As the phosphonate methyl group, a group represented by the following formula is illustrated:

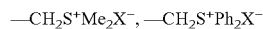

wherein X represents a halogen atom, and Ph represents a phenyl group.

As the phosphonate methyl group, a group represented by the following formula is illustrated:

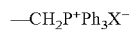

wherein R' represents an alkyl group, an aryl group, or an arylalkyl group.

As the methyl monohalide group, a methyl fluoride group, a methyl chloride group, a methyl bromide group, or a methyl iodide group is illustrated.

The substituents preferred as the substituents involved in condensation polymerization are different depending on the type of polymerization reaction, and include a halogen atom, an alkylsulfo group, an arylsulfo group, or an arylalkylsulfo group when, for example, a zero-valent nickel complex (Ni (0) complex) is used, such as in Yamamoto coupling reaction. Also, the substituents include an alkylsulfo group, a halogen atom, a borate group, and —B(OH)$_2$ when a nickel catalyst or a palladium catalyst is used, such as in Suzuki coupling reaction.

Specifically, the manufacturing method of the present invention can be performed by dissolving a compound having two substituents involved in condensation polymerization, which provides a monomer, in an organic solvent, as required, using, for example, an alkali or a suitable catalyst, and at a temperature equal to or higher than the melting point of the organic solvent and equal to or lower than its boiling point. For example, publicly known methods described in "Organic Reactions", Vol. 14, p. 270-490, John Wiley & Sons, Inc., 1965, "Organic Syntheses", Collective Volume VI, p. 407-411, John Wiley & Sons, Inc., 1988, Chem. Rev., Vol. 95, p. 2457 (1995), J. Organomet. Chem., Vol. 576, p. 147 (1999), Macromol. Chem., Macromol. Symp., Vol. 12, p. 229 (1987), and the like can be used.

As a method for manufacturing a block polymer, for example, publicly known methods described in WO2005/36666 and the like can be used.

In the method for manufacturing the block copolymer of the present invention, known condensation reaction can be used according to the substituents involved in condensation polymerization. For example, a method for polymerizing the monomer concerned by Suzuki coupling reaction, a method for polymerizing the monomer concerned by Grignard reaction, a method for polymerizing the monomer concerned by a zero-valent nickel complex, a method for polymerizing the monomer concerned by an oxidant, such as $FeCl_3$, a method for electrochemically oxidatively polymerizing the monomer concerned, or a method using the decomposition of an intermediate polymer having a suitable leaving group, and the like are illustrated. Among these, a method for polymerizing by Suzuki coupling reaction, a method for polymerizing by Grignard reaction, and a method for polymerizing by a zero-valent nickel complex are preferred because of easy structure control.

Among the manufacturing methods of the present invention, a manufacturing method is preferred, in which the substituents ($Y_1$, $Y_2$, $Y_3$, and $Y_4$) involved in condensation polymerization are independently selected from a halogen atom, an alkylsulfo group, an arylsulfo group, or an arylalkylsulfo group, and condensation polymerization is performed in the presence of a zero-valent nickel complex. The raw material compound includes, for example, a dihalogenated compound, a bis(alkylsulfonate) compound, a bis(arylsulfonate) compound, a bis(arylalkylsulfonate) compound, a halogen-alkylsulfonate compound, a halogen-arylsulfonate compound, a halogen-arylalkylsulfonate compound, an alkylsulfonate-arylsulfonate compound, an alkylsulfonate-arylalkylsulfonate compound, and an arylsulfonate-arylalkylsulfonate compound. A method for manufacturing a sequence-controlled block copolymer by using, among these, for example, a halogen-alkylsulfonate compound, a halogen-arylsulfonate compound, a halogen-arylalkylsulfonate compound, an alkylsulfonate-arylsulfonate compound, an alkylsulfonate-arylalkylsulfonate compound, or an arylsulfonate-arylalkylsulfonate compound, as the raw material compound, is mentioned.

Also, among the manufacturing methods of the present invention, a manufacturing method is preferred, in which the substituents ($Y_1$, $Y_2$, $Y_3$, and $Y_4$) involved in condensation polymerization are independently selected from a halogen atom, an alkylsulfo group, an arylsulfo group, an arylalkylsulfo group, a boric acid group (—$B(OH)_2$), or a borate group, the ratio of the total mole number of the boric acid group and borate group of all raw material compounds (K) with respect to the total mole number of the halogen atom, alkylsulfo group, arylsulfo group, and arylalkylsulfo group of all raw material compounds (J), K/J, is substantially 1 (usually in the range of 0.7 to 1.2), and condensation polymerization is performed using a nickel catalyst or a palladium catalyst. Specific combinations of raw material compounds include a combination of a dihalogenated compound, a bis(alkylsulfonate) compound, a bis(arylsulfonate) compound, or a bis(arylalkylsulfonate) compound, and a diboric acid compound or a diborate compound, and a halogen-boric acid compound, a halogen-borate compound, an alkylsulfonate-boric acid compound, an alkylsulfonate-borate compound, an arylsulfonate-boric acid compound, an arylsulfonate-borate compound, an arylalkylsulfonate-boric acid compound, and an arylalkylsulfonate-borate compound. A method for manufacturing a sequence-controlled block copolymer by using, among these, for example, a halogen-boric acid compound, a halogen-borate compound, an alkylsulfonate-boric acid compound, an alkylsulfonate-borate compound, an arylsulfonate-boric acid compound, an arylsulfonate-borate compound, an arylalkylsulfonate-boric acid compound, or an arylalkylsulfonate-borate compound, as the raw material compound, is mentioned.

The solvent used in reaction is different depending on the compound used and reaction and is generally preferably subjected to sufficient deoxidation treatment to suppress side reaction. Preferably, reaction is allowed to proceed in an inert atmosphere. Also, similarly, the solvent used in reaction is preferably subjected to dehydration treatment.

However, this does not apply to reaction in a two-phase system with water, such as Suzuki coupling reaction.

As the solvent, saturated hydrocarbons, such as pentane, hexane, heptane, octane, cyclohexane, and decalin, aromatic hydrocarbons, such as benzene, toluene, ethylbenzene, n-butylbenzene, xylene, and tetralin, halogenated saturated hydrocarbons, such as carbon tetrachloride, chloroform, dichloromethane, chlorobutane, bromobutane, chloropentane, bromopentane, chlorohexane, bromohexane, chlorocyclohexane, and bromocyclohexane, halogenated aromatic hydrocarbons, such as chlorobenzene, dichlorobenzene, and trichlorobenzene, alcohols, such as methanol, ethanol, propanol, isopropanol, butanol, and t-butyl alcohol, carboxylic acids, such as formic acid, acetic acid, and propionic acid, ethers, such as dimethyl ether, diethyl ether, methyl-t-butyl ether, tetrahydrofuran, tetrahydropyran, and dioxane, amines, such as trimethylamine, triethylamine, N,N,N',N'-tetramethylethylenediamine, and pyridine, amides, such as N,N-dimethylformamide, N,N-dimethylacetamide, N,N-diethylacetamide, and N-methylmorpholine oxide, and the like are illustrated. These solvents may be used alone, or mixed and used. Among these, ethers are preferred, and tetrahydrofuran and diethyl ether are further preferred.

For reaction, an alkali or a suitable catalyst is appropriately added. These should be selected according to reaction used. The alkali or the catalyst is preferably one that is sufficiently dissolved in the solvent used in reaction. The alkali includes, for example, inorganic bases, such as potassium carbonate and sodium carbonate; organic bases, such as triethylamine; and inorganic salts, such as cesium fluoride. The catalyst includes, for example, palladium[tetrakis(triphenylphosphine)] and palladium acetates. As a method for mixing the alkali or the catalyst, a method for slowly adding a solution of the alkali or the catalyst while stirring a reaction solution in an inert atmosphere, such as argon and nitrogen, or on the contrary a method for slowly adding a reaction solution to a solution of the alkali or the catalyst is illustrated.

When the block copolymer of the present invention is used in a polymer LED or the like, preferably, polymerization is performed after a monomer before polymerization is purified by a method, such as distillation, sublimation purification, and recrystallization, because the purity of the block copolymer affects the performance of the device, such as emission characteristics. Also, after polymerization, preferably, purification treatment, such as reprecipitation purification, and fractionation by chromatography, is performed.

<Composition>

The composition of the present invention is a composition containing:

the block copolymer of the present invention; and a solvent, a light-emitting material other than the block copolymer, a hole transport material other than the block copolymer, or an electron transport material other than the block copolymer, or a combination of two or more thereof. The composition may contain at least two types of the block copolymers.

The solvent can be added to turn the composition of the present invention into a liquid composition described later. As the solvent included in the composition, one in which components other than the solvent in the composition can be dissolved or dispersed is preferred. As the solvent, chlorine solvents, such as chloroform, methylene chloride, 1,2-dichloroethane, 1,1,2-trichloroethane, chlorobenzene, and o-dichlorobenzene, ether solvents, such as tetrahydrofuran and dioxane, aromatic hydrocarbon solvents, such as toluene, xylene, trimethylbenzene, and mesitylene, aliphatic hydrocarbon solvents, such as cyclohexane, methylcyclohexane, n-pentane, n-hexane, n-heptane, n-octane, n-nonane, and n-decane, ketone solvents, such as acetone, methyl ethyl ketone, and cyclohexanone, ester solvents, such as ethyl acetate, butyl acetate, methyl benzoate, and ethyl cellosolve acetate, polyalcohols, such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin, and 1,2-hexanediol, and derivatives thereof, alcohol solvents, such as methanol, ethanol, propanol, isopropanol, and cyclohexanol, sulfoxide solvents, such as dimethylsulfoxide, and amide solvents, such as N-methyl-2-pyrrolidone and N,N-dimethylformamide, are illustrated. Also, one of these solvents may be used alone, or a plurality of these solvents may be combined and used. It is preferred to comprise, among the solvents, one or more types of organic solvents having a structure containing at least one or more benzene rings and having a melting point of 0° C. or less and a boiling point of 100° C. or more, from the viewpoint of viscosity, a film formation property, and the like.

For the type of the solvent, from the viewpoint of the solubility of the components other than the solvent in the composition in the solvent, uniformity during film formation, viscosity characteristics, and the like, aromatic hydrocarbon solvents, aliphatic hydrocarbon solvents, ester solvents, and ketone solvents are preferred, and specifically, toluene, xylene, ethylbenzene, diethylbenzene, trimethylbenzene, mesitylene, n-propylbenzene, isopropylbenzene, n-butylbenzene, isobutylbenzene, s-butylbenzene, anisole, ethoxybenzene, 1-methylnaphthalene, cyclohexane, cyclohexanone, cyclohexylbenzene, bicyclohexyl, cyclohexenylcyclohexanone, n-heptylcyclohexane, n-hexylcyclohexane, methyl benzoate, 2-propylcyclohexanone, 2-heptanone, 3-heptanone, 4-heptanone, 2-octanone, 2-nonanone, 2-decanone, and dicyclohexyl ketone are preferred. It is more preferred to comprise at least one type of xylene, anisole, mesitylene, cyclohexylbenzene, and bicyclohexylmethyl benzoate.

For the type of the solvent included in the composition, two or more types are preferred, two to three types are more preferred, and two types are further preferred, from the viewpoint of a film formation property, device characteristics, and the like.

When two types of solvents are included in the composition, one type of solvent of these may be in a solid state at 25° C. From the viewpoint of a film formation property, preferably, one type of solvent has a boiling point of 180° C. or more, and the other type of solvent has a boiling point of less than 180° C., and more preferably, one type of solvent has a boiling point of 200° C. or more, and the other type of solvent has a boiling point of less than 180° C. Also, from the viewpoint of viscosity, preferably, 0.2% or more by weight of the components in the composition excluding the solvents are dissolved in the solvents at 60° C., and preferably, 0.2% or more by weight of the components in the composition excluding the solvents are dissolved in one type of solvent of the two types of solvents at 25° C.

When three types of solvents are included in the composition, one or two types of solvents of these may be in a solid state at 25° C. From the viewpoint of a film formation property, preferably, at least one type of solvent of the three types of solvents is a solvent having a boiling point of 180° C. or more, and at least one type of solvent is a solvent having a boiling point of less than 180° C., and more preferably, at least one type of solvent of the three types of solvents is a solvent having a boiling point of 200° C. or more and 300° C. or less, and at least one type of solvent is a solvent having a boiling point of less than 180° C. Also, from the viewpoint of viscosity, preferably, 0.2% or more by weight of the components in the composition excluding the solvents are dissolved in two types of solvents of the three types of solvents at 60° C., and preferably, 0.2% or more by weight of the components in the composition excluding the solvents are dissolved in one type of solvent of the three types of solvents at 25° C.

When two or more types of solvents are included in the composition, the solvent having the highest boiling point is preferably 40 to 90 wt % of the weight of all solvents included in the composition, more preferably 50 to 90% by weight, and further preferably 65 to 85% by weight, from the viewpoint of viscosity and a film formation property.

The block copolymer of the present invention can be used as the light-emitting material, hole transport material, and electron transport material of a light-emitting device, as described above. However, at least one of other light-emitting materials, hole transport materials, and electron transport materials can be added, as required, to modify the characteristics of the obtained light-emitting device.

The light-emitting material other than the block copolymer includes, for example, a low-molecular fluorescent material. Its specific examples include fluorescent materials of low-molecular compounds, such as naphthalene derivatives, anthracene, anthracene derivatives, perylene, perylene derivatives, dyes, such as a polymethine dye, a xanthene dye, a coumarin dye, and a cyanine dye, a metal complex having 8-hydroxyquinoline as a ligand, a metal complex having an 8-hydroxyquinoline derivative as a ligand, other fluorescent metal complexes, aromatic amine, tetraphenylcyclopentadiene, tetraphenylcyclopentadiene derivatives, tetraphenylbutadiene, tetraphenylbutadiene derivatives, stilbene, silicon-containing aromatic compounds, oxazole, furoxan, thiazole, tetraarylmethane, thiadiazole, pyrazole, metacyclophane, and acetylene, and specifically, publicly known ones, for example, those described in JP-A-57-51781 and JP-A-59-194393. One of these light-emitting materials may be used alone, or two or more of these light-emitting materials may be used in combination.

The hole transport material other than the block copolymer includes, for example, polyvinylcarbazole and its derivatives, polysilane and its derivatives, polysiloxane derivatives having aromatic amine in the side chain or the main chain, pyrazoline derivatives, arylamine derivatives, stilbene derivatives, triphenyldiamine derivatives, polyaniline and its derivatives, polythiophene and its derivatives, polypyrrole and its derivatives, poly(p-phenylenevinylene) and its derivatives, and poly(2,5-thienylenevinylene) and its derivatives. One of these hole transport materials may be used alone, or two or more of these hole transport materials may be used in combination.

The electron transport material other than the block copolymer includes, for example, oxadiazole derivatives, anthraquinodimethane and its derivatives, benzoquinone and its derivatives, naphthoquinone and its derivatives, anthraquinone and its derivatives, tetracyanoanthraquinodimethane and its derivatives, fluorenone derivatives, diphenyldicyanoethylene and its derivatives, diphenoquinone derivatives, metal complexes of 8-hydroxyquinoline and its derivatives, polyquinoline and its derivatives, polyquinoxaline and its derivatives, and polyfluorene and its derivatives. One of these electron transport materials may be used alone, or two or more of these electron transport materials may be used in combination.

The composition of the present invention may comprise a stabilizer, an additive for adjusting viscosity and/or surface tension, an antioxidant, and the like, as other optional components, as required, other than the block copolymer, the solvent, the light-emitting material other than the block copolymer, the hole transport material other than the block copolymer, and the electron transport material other than the block copolymer. One of each of these optional components may be used alone, or two or more of each of these optional components may be used in combination.

The stabilizer that may be contained in the composition of the present invention includes, for example, a phenol antioxidant and a phosphorus antioxidant.

The additive for adjusting viscosity and/or surface tension that may be contained in the composition of the present invention includes, for example, a high-molecular-weight compound (thickener) and a poor solvent for increasing viscosity, a low-molecular-weight compound for decreasing viscosity, and a surfactant for decreasing surface tension, and a combination thereof.

The high-molecular-weight compound should be one not inhibiting emission or charge transport, and when the composition comprises a solvent, the high-molecular-weight compound is usually one soluble in the solvent. As the high-molecular-weight compound, for example, high-molecular-weight polystyrene, high-molecular-weight polymethyl methacrylate, and the like can be used. The high-molecular-weight compound preferably has a polystyrene equivalent weight average molecular weight of 500,000 or more, and more preferably 1,000,000 or more. Also, a poor solvent can be used as a thickener.

The antioxidant that may be contained in the composition of the present invention should be one not inhibiting emission or charge transport, and when the composition comprises a solvent, the antioxidant is usually one soluble in the solvent.

As the antioxidant, a phenol antioxidant, a phosphorus antioxidant, and the like are illustrated. The use of the antioxidant can improve the storage stability of the block copolymer and the solvent.

In this specification, a "liquid composition" means one that comprises the block copolymer and a solvent and is liquid during device fabrication, typically, at normal pressure (that is, 1 atmospheric pressure) and 25° C. The liquid composition may be generally called an ink, an ink composition, a solution, or the like. The liquid composition of the present invention is useful for the fabrication of a light-emitting device, such as a polymer light-emitting device, and an organic transistor.

When a film is formed using this liquid composition in fabricating a polymer light-emitting device, after coating with the liquid composition, the solvent need only be removed by drying. Also, when the light-emitting material, the hole transport material, or the charge transport material is mixed, a similar method can be applied. Therefore, such a film formation is very advantageous in manufacture. In drying, drying may be performed with the temperature increased to about 50 to 150° C., and drying may be performed with the pressure reduced to about $10^{-3}$ Pa.

As the film formation method using the liquid composition, coating methods, such as a spin coating method, a casting method, a microgravure coating method, a gravure coating method, a bar coating method, a roll coating method, a wire bar coating method, a dip coating method, a slit coating method, a capillary coating method, a spray coating method, a screen printing method, a flexographic printing method, an offset printing method, an ink jet printing method, and a nozzle coating method, can be used. Printing methods, such as a screen printing method, a flexographic printing method, an offset printing method, and an ink jet printing method, are preferred in that pattern formation and the separate application of many colors are easy.

The viscosity of the liquid composition is different depending on the printing method and is preferably in the range of 0.5 to 500 mPa·s at 25° C. In the case of a printing method in which the liquid composition passes through an ejection apparatus, such as an ink jet printing method, the viscosity is preferably in the range of 0.5 to 20 mPa·s at 25° C. to prevent clogging and flight bending during ejection.

The ratio of the block copolymer of the present invention in the composition of the present invention is usually 1% to 98% by weight, preferably 10% to 95% by weight, and further preferably 20% to 90% by weight, with respect to the total weight of the composition.

When the composition of the present invention contains a solvent, the ratio of the solvent in the composition is usually 1% to 99.9% by weight, preferably 60% to 99.9% by weight, and further preferably 90% to 99.8% by weight, with respect to the total weight of the composition.

When the composition of the present invention contains a light-emitting material other than the block copolymer of the present invention, the ratio of the light-emitting material in the composition is usually 1% to 80% by weight, and preferably 5% to 60% by weight, with respect to the total weight of the composition.

When the composition of the present invention contains a hole transport material other than the block copolymer of the present invention, the ratio of the hole transport material in the composition is usually 1% to 80% by weight, and preferably 5% to 60% by weight, with respect to the total weight of the composition.

When the composition of the present invention contains an electron transport material other than the block copolymer of the present invention, the ratio of the electron transport material in the composition is usually 1% to 80% by weight, and preferably 5% to 60% by weight, with respect to the total weight of the composition.

In the composition of the present invention, the total of the ratio of the block copolymer of the present invention, the ratio of the solvent, the light-emitting material other than the block copolymer, the hole transport material other than the block copolymer, or the electron transport material other than the block copolymer, or a combination of two or more thereof, and the ratio of the above other optional components added as required is 100 wt % with respect to the total weight of the composition.

<Use>

The block copolymer of the present invention can be used not only as a light-emitting material, but also as a thin film, an organic semiconductor material, an organic transistor, an optical material, or a solar cell, or as a conductive material by doping.

The thin film of the present invention will be described. This thin film is formed by using the block copolymer. As the types of the thin film, a light-emitting thin film, a conductive thin film, an organic semiconductor thin film, and the like are illustrated.

The light-emitting thin film of the present invention contains the block copolymer of the present invention. The light-emitting thin film may further contain a light-emitting material other than the block copolymer, a hole transport material other than the block copolymer, or an electron transport material other than the block copolymer, or a combination of two or more thereof. Examples of these light-emitting material, hole transport material, and electron transport material are as described above. From the viewpoint of the luminance of the device, emission voltage, and the like, the light-emitting thin film preferably has an emission quantum yield of 50% or more, more preferably 60% or more, and further preferably 70% or more.

The conductive thin film preferably has a surface resistance of 1 KΩ/□ or less. Doping the thin film with Lewis acid, an ionic compound, or the like can increase conductivity. The surface resistance is more preferably 100Ω/□ or less, and further preferably 10Ω/□ or less.

For the organic semiconductor thin film, either higher one of the electron mobility or the hole mobility is preferably $10^{-5}$ cm$^2$/V second or more, more preferably $10^{-3}$ cm$^2$/V second or more, and further preferably $10^{-1}$ cm$^2$/V second or more. Also, the organic semiconductor thin film can be used to fabricate an organic transistor. Specifically, an organic transistor can be provided by forming the organic semiconductor thin film on a Si substrate on which an insulating film of SiO$_2$ or the like and a gate electrode are formed and forming a source electrode and a drain electrode with Au or the like.

Next, a polymer field effect transistor, one aspect of the organic transistor, will be described.

The block copolymer of the present invention can be suitably used as a material of a polymer field effect transistor, especially as an active layer. For the structure of the polymer field effect transistor, usually, a source electrode and a drain electrode should be provided in contact with an active layer of a polymer, and a gate electrode should be further provided sandwiching an insulating layer in contact with the active layer.

The polymer field effect transistor is usually formed on a supporting substrate. The material of the supporting substrate is not particularly limited as long as the characteristics of the field effect transistor are not inhibited. As the supporting substrate, a glass substrate, a flexible film substrate, and a plastic substrate can also be used, in addition to the Si substrate.

The polymer field effect transistor can be manufactured by a publicly known method, for example, a method described in JP-A-5-110069.

In forming the active layer, using a solution obtained by dissolving the block copolymer of the present invention in a solvent is very advantageous and preferred in manufacture. As the method for film formation from the solution, coating methods, such as a spin coating method, a casting method, a microgravure coating method, a gravure coating method, a bar coating method, a roll coating method, a wire bar coating method, a dip coating method, a slit coating method, a capillary coating method, a spray coating method, a screen printing method, a flexographic printing method, an offset printing method, an ink jet printing method, and a nozzle coating method, can be used. Printing methods, such as a screen printing method, a flexographic printing method, an offset printing method, and an ink jet printing method, are preferred in that pattern formation and the separate application of many colors are easy.

A sealed polymer field effect transistor obtained by sealing a polymer field effect transistor after fabricating it is preferred. Thus, the polymer field effect transistor is cut off from the air, and a decrease in the characteristics of the polymer field effect transistor can be suppressed.

The sealing method includes a method for covering with an ultraviolet (UV) curing resin, a thermosetting resin, an inorganic SiONx film, or the like, and a method for bonding a glass plate or a film with a UV curing resin, a thermosetting resin, or the like. Preferably, steps after the fabrication of the polymer field effect transistor until sealing are performed without exposure to the air (for example, in a dry nitrogen atmosphere, in a vacuum, and the like) to effectively cut off from the air.

Next, an organic solar cell will be described. A solid photoelectric conversion device that is an organic photoelectric conversion device, one aspect of the organic solar cell, and uses photovoltaic effect will be described.

The block copolymer of the present invention can be suitably used as a material of an organic photoelectric conversion device, especially as the organic semiconductor layer of a Schottky barrier type device using the interface between an organic semiconductor and metal, and also as the organic semiconductor layer of a pn heterojunction type device using the interface between an organic semiconductor and an inorganic semiconductor or organic semiconductors.

Further, the block copolymer of the present invention can be suitably used as an electron-donating polymer and an electron-accepting polymer in a bulk heterojunction type device in which the contact area of the donor and the acceptor is increased, and also as the electron-donating conjugated polymer (dispersed support) of an organic photoelectric conversion device using a polymer and low-molecular compound composite system, for example, a bulk heterojunction type organic photoelectric conversion device in which a fullerene derivative is dispersed as an electron acceptor.

For the structure of the organic photoelectric conversion device, for example, in a pn heterojunction type device, a p-type semiconductor layer should be formed on an ohmic electrode, for example, ITO, an n-type semiconductor layer should be further laminated, and an ohmic electrode should be provided on the n-type semiconductor layer.

The organic photoelectric conversion device is usually formed on a supporting substrate. The material of the supporting substrate is not particularly limited as long as the characteristics of the organic photoelectric conversion device are not inhibited. As the supporting substrate, a glass substrate, a flexible film substrate, and a plastic substrate can also be used, in addition to a Si substrate.

The organic photoelectric conversion device can be manufactured by publicly known methods, for example, a method described in Synth. Met., 102, 982 (1999) and a method described in Science, 270, 1789 (1995).

Next, the polymer light-emitting device of the present invention will be described.

The polymer light-emitting device of the present invention comprises:
an anode;
a cathode; and
an organic layer comprising the block copolymer and provided between the anode and the cathode. The organic layer may further comprise a light-emitting material other than the block copolymer, a hole transport material other than the block copolymer, or an electron transport material other than the block copolymer, or a combination of two or more thereof. Examples of these light-emitting material, hole transport material, and electron transport material are as described above. in the polymer light-emitting device of the present invention, the organic layer is preferably a light-emitting layer.

Also, the polymer light-emitting device of the present invention includes (1) a polymer light-emitting device in which an electron transport layer is provided between a cathode and a light-emitting layer, (2) a polymer light-emitting device in which a hole transport layer is provided between an anode and a light-emitting layer, and (3) a polymer light-emitting device in which an electron transport layer is provided between a cathode and a light-emitting layer, and a hole transport layer is provided between an anode and the light-emitting layer.

More specifically, the following structures a) to d) are illustrated.

a) anode/light-emitting layer/cathode
b) anode/hole transport layer/light-emitting layer/cathode
c) anode/light-emitting layer/electron transport layer/cathode
d) anode/hole transport layer/light-emitting layer/electron transport layer/cathode (Here, "/" represents that layers are laminated adjacent to each other. The same applies hereinafter.)

Here, the light-emitting layer is a layer having the function of emitting light, the hole transport layer is a layer having the function of transporting holes, and the electron transport layer is a layer having the function of transporting electrons. The electron transport layer and the hole transport layer are collectively called a charge transport layer. Two or more light-emitting layers, two or more hole transport layers, and two or more electron transport layers may be used.

Also, the hole transport layer adjacent to the light-emitting layer may also be called an interlayer layer.

The method for forming the light-emitting layer is not limited, and a method of film formation from a solution is illustrated.

As the method for film formation from a solution, coating methods, such as a spin coating method, a casting method, a microgravure coating method, a gravure coating method, a bar coating method, a roll coating method, a wire bar coating method, a dip coating method, a slit coating method, a capillary coating method, a spray coating method, a screen printing method, a flexographic printing method, an offset printing method, an ink jet printing method, and a nozzle coating method, can be used. Printing methods, such as a screen printing method, a flexographic printing method, an offset printing method, and an ink jet printing method, are preferred in that pattern formation and the separate application of many colors are easy.

When a film is formed from a solution by using the block copolymer of the present invention in fabricating the polymer light-emitting device, after coating with this solution, the solvent need only be removed by drying. Also, when the light-emitting material, the hole transport material, or the charge transport material is mixed, a similar method can be applied. Therefore, such a film formation is very advantageous in manufacture.

The optimal value of the film thickness of the light-emitting layer is different depending on the material used, and the film thickness should be selected so that the driving voltage and the luminous efficiency are suitable values. The film thickness of the light-emitting layer is, for example, 1 nm to 1 μm, preferably 2 nm to 500 nm, and further preferably 5 nm to 200 nm.

In the polymer light-emitting device of the present invention, a light-emitting material other than the above block copolymer may be mixed and used for the light-emitting layer. Also, in the polymer light-emitting device of the present invention, a light-emitting layer comprising a light-emitting material other than the above block copolymer may be laminated with a light-emitting layer comprising the above block copolymer.

As the light-emitting material other than the block copolymer, a publicly known one can be used. For low-molecular compounds, for example, naphthalene derivatives, anthracene and its derivatives, perylene and its derivatives, dyes, such as polymethine, xanthene, coumarin, and cyanine, metal complexes of 8-hydroxyquinoline and its derivatives, aromatic amine, tetraphenylcyclopentadiene and its derivatives, tetraphenylbutadiene and its derivatives, and the like can be used.

Specifically, publicly known ones, for example, those described in JP-A-57-51781 and JP-A-59-194393, can be used.

When the polymer light-emitting device of the present invention has the hole transport layer, as the hole transport material used, polyvinylcarbazole and its derivatives, polysilane and its derivatives, polysiloxane derivatives having aromatic amine in the side chain or the main chain, pyrazoline derivatives, arylamine derivatives, stilbene derivatives, triphenyldiamine derivatives, polyaniline and its derivatives, polythiophene and its derivatives, polypyrrole and its derivatives, poly(p-phenylenevinylene) and its derivatives, and poly(2,5-thienylenevinylene) and its derivatives are illustrated. Specifically, as the hole transport material, those described in JP-A-63-70257, JP-A-63-175860, JP-A-2-135359, JP-A-2-135361, JP-A-2-209988, JP-A-3-37992, and JP-A-3-152184, and the like are illustrated.

Among these, as the hole transport material used for the hole transport layer, polymer hole transport materials, such as polyvinylcarbazole and its derivatives, polysilane and its derivatives, polysiloxane derivatives having an aromatic amine compound group in the side chain or the main chain, polyaniline and its derivatives, polythiophene and its derivatives, poly(p-phenylenevinylene) and its derivatives, and poly(2,5-thienylenevinylene) and its derivatives, are preferred, and polyvinylcarbazole and its derivatives, polysilane and its derivatives, and polysiloxane derivatives having aromatic amine in the side chain or the main chain are further preferred. A low-molecular hole transport material is preferably dispersed in a polymer binder and used.

Polyvinylcarbazole and its derivatives are obtained, for example, by the cationic polymerization or radical polymerization of a vinyl monomer.

As polysilane and its derivatives, compounds described in Chem. Rev., Vol. 89, p. 1359 (1989), and British Patent GB2300196, and the like are illustrated. Also for the synthesis method, methods described in these can be used, and particularly, the Kipping method is suitably used.

For polysiloxane derivatives, the siloxane skeleton structure hardly has a hole transport property, so that one having the structure of the above low-molecular hole transport material in the side chain or the main chain is suitably used. Particularly, one having aromatic amine having a hole transport property in the side chain or the main chain is illustrated.

The method for forming the hole transport layer is not limited. For the low-molecular hole transport material, a method of film formation from a mixed solution of the low-molecular hole transport material and a polymer binder is illustrated. Also, for the polymer hole transport material, a method of film formation from a solution is illustrated.

The solvent used for film formation from a solution is not particularly limited as long as the hole transport material is dissolved in the solvent. As the solvent, chlorine solvents, such as chloroform, methylene chloride, and dichloroethane, ether solvents, such as tetrahydrofuran, aromatic hydrocarbon solvents, such as toluene and xylene, ketone solvents, such as acetone and methyl ethyl ketone, and ester solvents, such as ethyl acetate, butyl acetate, and ethyl cellosolve acetate, are illustrated.

As the method for film formation from a solution, coating methods, such as a spin coating method, a casting method, a microgravure coating method, a gravure coating method, a bar coating method, a roll coating method, a wire bar coating method, a dip coating method, a slit coating method, a capillary coating method, a spray coating method, a screen printing method, a flexographic printing method, an offset printing method, an ink jet printing method, and a nozzle coating method, can be used. Printing methods, such as a screen printing method, a flexographic printing method, an offset printing method, and an ink jet printing method, are preferred in that pattern formation and the separate application of many colors are easy.

As the polymer binder mixed, one not extremely inhibiting charge transport is preferred, and also, one not strongly absorbing visible light is suitably used. As the polymer binder, polycarbonate, polyacrylate, polymethyl acrylate, polymethyl methacrylate, polystyrene, polyvinyl chloride, polysiloxane, and the like are illustrated.

The optimal value of the film thickness of the hole transport layer is different depending on the material used, and the film thickness should be selected so that the driving voltage and the luminous efficiency are suitable values. However, at least a thickness such that no pinholes occur is necessary. If the thickness is too thick, the driving voltage of the device is high, so that too thick thickness is not preferred. Therefore, the film thickness of the hole transport layer is, for example, 1 nm to 1 μm, preferably 2 nm to 500 nm, and further preferably 5 nm to 200 nm.

When the polymer light-emitting device of the present invention has the electron transport layer, as the electron transport material used, a publicly known one can be used, and oxadiazole derivatives, anthraquinodimethane and its derivatives, benzoquinone and its derivatives, naphthoquinone and its derivatives, anthraquinone and its derivatives, tetracyanoanthraquinodimethane and its derivatives, fluorenone derivatives, diphenyldicyanoethylene and its derivatives, diphenoquinone derivatives, metal complexes of 8-hydroxyquinoline and its derivatives, polyquinoline and its derivatives, polyquinoxaline and its derivatives, and polyfluorene and its derivatives are illustrated. Specifically, those described in JP-A-63-70257, JP-A-63-175860, JP-A-2-135359, JP-A-2-135361, JP-A-2-209988, JP-A-3-37992, and JP-A-3-152184, and the like are illustrated.

Among these, oxadiazole derivatives, benzoquinone and its derivatives, anthraquinone and its derivatives, metal complexes of 8-hydroxyquinoline and its derivatives, polyquinoline and its derivatives, polyquinoxaline and its derivatives, and polyfluorene and its derivatives are preferred, and 2-(4-biphenylyl)-5-(4-t-butylphenyl)-1,3,4-oxadiazole, benzoquinone, anthraquinone, tris(8-quinolinol)aluminum, and polyquinoline are further preferred.

The method for forming the electron transport layer is not particularly limited. For the low-molecular electron transport material, a method for vacuum deposition from a powder, and a method of film formation from a solution or a melted state are illustrated. For the polymer electron transport material, a method of film formation from a solution or a melted state is illustrated. During film formation from a solution or a melted state, a polymer binder may be used in combination.

The solvent used for film formation from a solution is not particularly limited as long as the electron transport material and/or the polymer binder are dissolved in the solvent. As the solvent, chlorine solvents, such as chloroform, methylene chloride, and dichloroethane, ether solvents, such as tetrahydrofuran, aromatic hydrocarbon solvents, such as toluene and xylene, ketone solvents, such as acetone and methyl ethyl ketone, and ester solvents, such as ethyl acetate, butyl acetate, and ethyl cellosolve acetate, are illustrated.

As the method for film formation from a solution or a melted state, coating methods, such as a spin coating method, a casting method, a microgravure coating method, a gravure coating method, a bar coating method, a roll coating method, a wire bar coating method, a dip coating method, a slit coating method, a capillary coating method, a spray coating method, a screen printing method, a flexographic printing method, an offset printing method, an ink jet printing method, and a nozzle coating method, can be used. Printing methods, such as a screen printing method, a flexographic printing method, an offset printing method, and an ink jet printing method, are preferred in that pattern formation and the separate application of many colors are easy.

As the polymer binder mixed, one not extremely inhibiting charge transport is preferred, and also, one not strongly absorbing visible light is suitably used. As the polymer binder, poly(N-vinylcarbazole), polyaniline and its derivatives, polythiophene and its derivatives, poly(p-phenylenevinylene) and its derivatives, poly(2,5-thienylenevinylene) and its derivatives, polycarbonate, polyacrylate, polymethyl acrylate, polymethyl methacrylate, polystyrene, polyvinyl chloride, polysiloxane, and the like are illustrated.

The optimal value of the film thickness of the electron transport layer is different depending on the material used, and the film thickness should be selected so that the driving voltage and the luminous efficiency are suitable values. However, at least a thickness such that no pinholes occur is necessary. If the thickness is too thick, the driving voltage of the device is high, so that too thick thickness is not preferred. Therefore, the film thickness of the electron transport layer is, for example, 1 nm to 1 μm, preferably 2 nm to 500 nm, and further preferably 5 nm to 200 nm.

Also, among the charge transport layers provided adjacent to the electrode, particularly, one having the function of improving the efficiency of charge injection from the electrode and having the effect of decreasing the driving voltage of the device may be generally called a charge injection layer (a hole injection layer or an electron injection layer).

Further, for an improvement in adhesion to the electrode, and an improvement in charge injection from the electrode, the charge injection layer or an insulating layer may be provided adjacent to the electrode. Also, for an improvement in the adhesion of the interface, the prevention of mixing, and the like, a thin buffer layer may be inserted at the interface of the charge transport layer and the light-emitting layer.

The order and number of layers laminated, and the thickness of each layer should be appropriately selected considering luminous efficiency and device life.

In the present invention, the polymer light-emitting device in which the charge injection layer (the electron injection layer or the hole injection layer) is provided includes a polymer light-emitting device in which the charge injection layer is provided adjacent to either one or both of the cathode and the anode.

For example, specifically, the following structures e) to p) are mentioned.
e) anode/charge injection layer/light-emitting layer/cathode
f) anode/light-emitting layer/charge injection layer/cathode
g) anode/charge injection layer/light-emitting layer/charge injection layer/cathode
h) anode/charge injection layer/hole transport layer/light-emitting layer/cathode
i) anode/hole transport layer/light-emitting layer/charge injection layer/cathode
j) anode/charge injection layer/hole transport layer/light-emitting layer/charge injection layer/cathode k) anode/charge injection layer/light-emitting layer/charge transport layer/cathode
l) anode/light-emitting layer/electron transport layer/charge injection layer/cathode
m) anode/charge injection layer/light-emitting layer/electron transport layer/charge injection layer/cathode
n) anode/charge injection layer/hole transport layer/light-emitting layer/charge transport layer/cathode
o) anode/hole transport layer/light-emitting layer/electron transport layer/charge injection layer/cathode
p) anode/charge injection layer/hole transport layer/light-emitting layer/electron transport layer/charge injection layer/cathode As specific examples of the charge injection layer, a layer comprising a conductive polymer, a layer provided between an anode and a hole transport layer and comprising a material having an ionization potential of an intermediate value between that of the anode material and that of the hole transport material included in the hole transport layer, a layer provided between a cathode and an electron transport layer and comprising a material having an electron affinity of an intermediate value between that of the cathode material and that of the electron transport material included in the electron transport layer, and the like are illustrated.

When the above charge injection layer is a layer comprising a conductive polymer, the conductivity of the conductive polymer is preferably $10^{-5}$ S/cm or more and $10^3$ S/cm or less, and to decrease the leak current between light-emitting pixels, the conductivity of the conductive polymer is more preferably $10^{-5}$ S/cm or more and $10^2$ S/cm or less, and further preferably $10^{-5}$/cm or more and $10^1$ S/cm or less. Usually, to provide the conductive polymer having a conductivity of $10^{-5}$ S/cm or more and $10^3$ S/cm or less, the conductive polymer is doped with a suitable amount of ions.

The type of doping ions is anions for the hole injection layer and cations for the electron injection layer. Examples of anions include polystyrenesulfonic acid ions, alkylbenzenesulfonic acid ions, and camphorsulfonic acid ions. Examples of cations include lithium ions, sodium ions, potassium ions, and tetrabutylammonium ions.

The film thickness of the charge injection layer is, for example, 1 nm to 100 nm, and preferably 2 nm to 50 nm.

The material used for the charge injection layer should be appropriately selected in relationship with the materials of the electrode and the adjacent layer, and conductive polymers, such as polyaniline and its derivatives, polythiophene and its derivatives, polypyrrole and its derivatives, polyphenylenevinylene and its derivatives, polythienylenevinylene and its derivatives, polyquinoline and its derivatives, polyquinoxaline and its derivatives, and a polymer comprising an aromatic amine structure in the main chain or the side chain, metal phthalocyanine (copper phthalocyanine and the like), carbon, and the like are illustrated.

The insulating layer has the function of facilitating charge injection. The average thickness of this insulating layer is usually 0.1 to 20 nm, preferably 0.5 to 10 nm, and more preferably 1 to 5 nm. The material of the insulating layer includes metal fluoride, metal oxide, and an organic insulating material. The polymer light-emitting device in which the insulating layer is provided includes a polymer light-emitting device in which the insulating layer is provided adjacent to either one or both of the cathode and the anode.

Specifically, for example, the following structures q) to ab) are mentioned.
q) anode/insulating layer/light-emitting layer/cathode
r) anode/light-emitting layer/insulating layer/cathode
s) anode/insulating layer/light-emitting layer/insulating layer/cathode
t) anode/insulating layer/hole transport layer/light-emitting layer/cathode
u) anode/hole transport layer/light-emitting layer/insulating layer/cathode
v) anode/insulating layer/hole transport layer/light-emitting layer/insulating layer/cathode
w) anode/insulating layer/light-emitting layer/electron transport layer/cathode
x) anode/light-emitting layer/electron transport layer/insulating layer/cathode
y) anode/insulating layer/light-emitting layer/electron transport layer/insulating layer/cathode
z) anode/insulating layer/hole transport layer/light-emitting layer/electron transport layer/cathode
aa) anode/hole transport layer/light-emitting layer/electron transport layer/insulating layer/cathode
ab) anode/insulating layer/hole transport layer/light-emitting layer/electron transport layer/insulating layer/cathode The substrate forming the polymer light-emitting device of the present invention should be one that does not change in forming the electrode and the layer of an organic substance. For example, substrates of glass, plastic, a polymer film, silicon, and the like are illustrated. For an opaque substrate, the electrode opposite to the electrode closer to the substrate is preferably transparent or semitransparent.

In the present invention, usually, at least one of electrodes of an anode and a cathode is transparent or semitransparent, and preferably, the anode side is transparent or semitransparent.

As the material of the anode, a conductive metal oxide film, a semitransparent metal thin film, and the like are used. Specifically, a film made by conductive glass of indium oxide, zinc oxide, tin oxide, and composites thereof, indium tin oxide (ITO) and indium zinc oxide, and the like (NESA and the like), as well as gold, platinum, silver, copper, and the like are used, and ITO, indium zinc oxide, and tin oxide are preferred. The fabrication method includes a vacuum deposition method, a sputtering method, an ion plating method, and a plating method. Also, as the anode, an organic transparent conductive film of polyaniline and its derivatives, polythiophene and its derivatives, and the like may be used.

The film thickness of the anode can be appropriately selected considering light transmissiveness, and conductivity, and is, for example, 10 nm to 10 µm, preferably 20 nm to 1 µm, and further preferably 50 nm to 500 nm.

Also, to facilitate charge injection, a layer of a phthalocyanine derivative, a conductive polymer, carbon, or the like, or a layer of metal oxide, metal fluoride, an organic insulating material, or the like may be provided on the anode.

As the material of the cathode, a material having a small work function is preferred. For example, metals, such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium, and alloys of two or more of these, or alloys of one or more of these and one or more of gold, silver, platinum, copper, manganese, titanium, cobalt, nickel, tungsten, and tin, and graphite or intercalated graphite, and the like are used. Examples of the alloys include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy. The cathode may be a laminated structure of two or more layers.

The film thickness of the cathode can be appropriately selected considering conductivity and durability, and is, for example, 10 nm to 10 μm, preferably 20 nm to 1 μm, and further preferably 50 nm to 500 nm.

As the method for fabricating the cathode, a vacuum deposition method, a sputtering method, and also a lamination method in which a metal thin film is subjected to thermocompression, and the like are used. Also, a layer of a conductive polymer, or a layer of metal oxide, metal fluoride, an organic insulating material, or the like may be provided between the cathode and the organic layer, and after the fabrication of the cathode, a protective layer for protecting the polymer light-emitting device may be mounted. To use the polymer light-emitting device stably for a long period, preferably, a protective layer and/or a protective cover are mounted to externally protect the device.

As the protective layer, a resin, metal oxide, metal fluoride, metal boride, and the like can be used. Also, as the protective cover, a glass plate, a plastic plate having a surface subjected to low water permeability treatment, and the like can be used, and a method in which the cover is bonded to the device substrate with a thermosetting resin or a light curing resin for enclosure is suitably used. When a spacer is used to maintain space, it is easy to prevent the device from being damaged. When the space is filled with an inert gas, such as nitrogen and argon, cathode oxidation can be prevented. Further, by placing a drying agent, such as barium oxide, in the space, it is easy to suppress that moisture adsorbed in the manufacturing process damages the device. Preferably, any one or more measures of these are taken.

The polymer light-emitting device of the present invention can be used in displays, such as a planar light source, a segment display, a dot matrix display, and a liquid crystal display (for example, a backlight), and the like.

To obtain planar emission using the polymer light-emitting device of the present invention, a planar anode and cathode should be located to overlap each other. Also, to obtain patterned emission, there are a method in which a mask in which a patterned window is provided is placed on a surface of the planar light-emitting device, a method in which the organic layer in the non-light-emitting part is formed extremely thick for substantial non-emission, and a method in which either one of an anode or a cathode, or both are formed in a pattern. By forming a pattern by any of these methods and locating several electrodes to be independently turned ON/OFF, a segment type display device which can display numerals, letters, simple symbols, and the like is obtained. Further, to provide a dot matrix device, an anode and a cathode both should be formed in stripes and located orthogonal to each other. By a method in which a plurality of types of polymer compounds having different emission colors are separately applied, and a method using a color filter or a fluorescence conversion filter, partial color display and multicolor display are possible. For the dot matrix device, passive drive is also possible, and active drive may be performed in combination with TFT and the like. These display devices can be used as the displays of a computer, a television, a portable terminal, a cellular phone, car navigation, a video camera viewfinder, and the like.

Further, the planar light-emitting device is of a self-light-emitting thin type and can be suitably used as a planar light source for the backlight of a liquid crystal display, or a planar light source for illumination. Also, when a flexible substrate is used, the light-emitting device can also be used as a curved light source and display.

EXAMPLES

Examples and comparative examples are illustrated below to describe the present invention in more detail, however, the present invention is not limited to these examples.

Example 1

Synthesis of Polymer Compound <P-1>

Content of Total of Repeating Units Represented by Formula (I): 2.5 Mol % with Respect to All Repeating Units

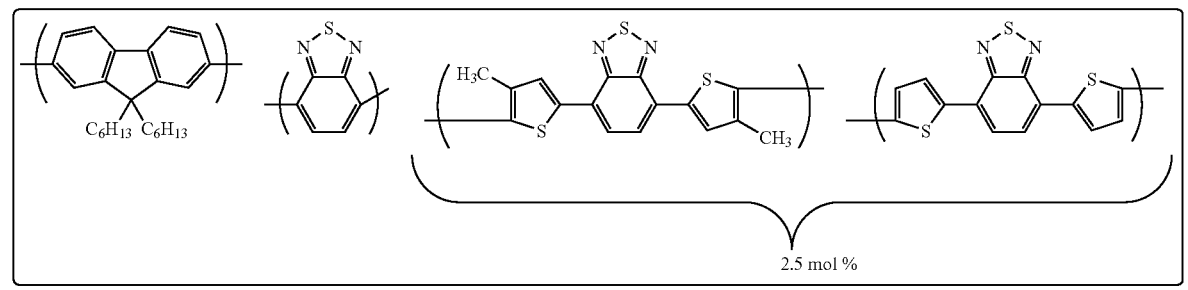

Block A

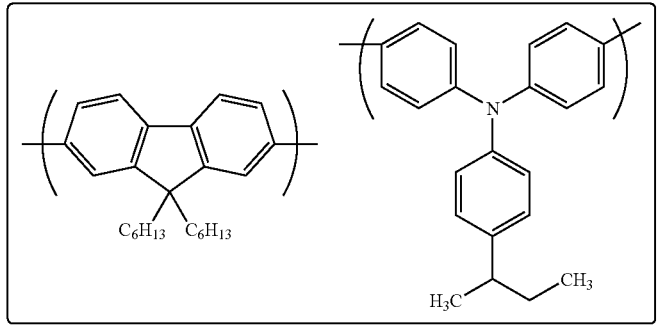

Block B

In an inert atmosphere, 2,7-bis(1,3,2-dioxaborolane-2-yl)-9,9-dihexylfluorene (0.68 g), 4,7-dibromo-2,1,3-benzothiadiazole (0.40 g), 4,7-bis(5-bromo-4-methyl-2-thienyl)-2,1,3-benzothiadiazole (0.88 g), 4,7-bis(5-bromo-2-thienyl)-2,1,3-benzothiadiazole (0.02 g), dichlorobis(triphenylphosphine) palladium (3.3 mg), Aliquat 336 (0.20 g, manufactured by Aldrich), and toluene (16 mL) were mixed and heated to 105° C. A 2M Na$_2$CO$_3$ aqueous solution (5 mL) was dropped into this reaction solution, and the mixture was refluxed for 4 hours. The weight average molecular weight based on polystyrene standards, at this time, was 1.4×10$^4$. After cooling to 70° C., 2,7-bis(1,3,2-dioxaborolane-2-yl)-9,9-dihexylfluorene (1.62 g), 2,7-dibromo-9,9-dihexylfluorene (0.72 g), bis(4-bromophenyl)-(4-secondary butylphenyl)-amine (0.89 g), dichlorobis(triphenylphosphine)palladium (7.1 mg), Aliquat 336 (0.44 g, manufactured by Aldrich), and toluene (35 mL) were mixed with the reaction solution and heated to 105° C. A 2M Na$_2$CO$_3$ aqueous solution (9 mL) was dropped into this reaction solution, and the mixture was refluxed for 7 hours. After reaction, phenyl boric acid (0.05 g) was added, and the mixture was further refluxed for 2 hours. Then, a sodium diethyldithiacarbamate aqueous solution was added, and the mixture was stirred at 80° C. for 2 hours. After cooling, the solution was washed with water (100 mL) three times, with a 3 wt % acetic acid aqueous solution (100 mL) three times, and with water (100 mL) three times, and passed through an alumina column and a silica gel column for purification. The obtained toluene solution was dropped into methanol (1.5 L), and the mixture was stirred for 1 hour, then, the obtained solid was filtered and dried. The yield of the obtained polymer compound <P-1> was 2.31 g.

The polymer compound <P-1> had a polystyrene equivalent number average molecular weight of 3.9×10$^4$ and a polystyrene equivalent weight average molecular weight of 8.7×10$^4$.

4,7-dibromo-2,1,3-benzothiadiazole was synthesized by a method described in U.S. Pat. No. 3,577,427. 4,7-bis(5-bromo-2-thienyl)-2,1,3-benzothiadiazole and 4,7-bis(5-bromo-4-methyl-2-thienyl)-2,1,3-benzothiadiazole were synthesized by a method described in WO00/046321. Bis(4-bromophenyl)-(4-secondary butylphenyl)-amine was synthesized by a method described in WO02/045184.

Example 2

Synthesis of Polymer Compound <P-2>

Content of Total of Repeating Units Represented by Formula (I): 6 Mol % with Respect to All Repeating Units

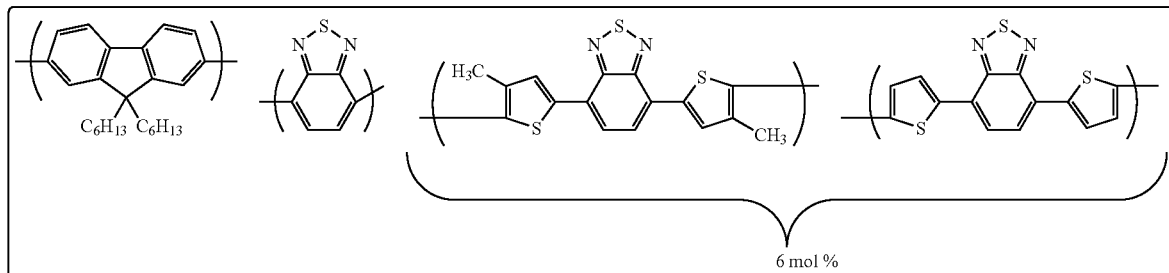

Block A

-continued

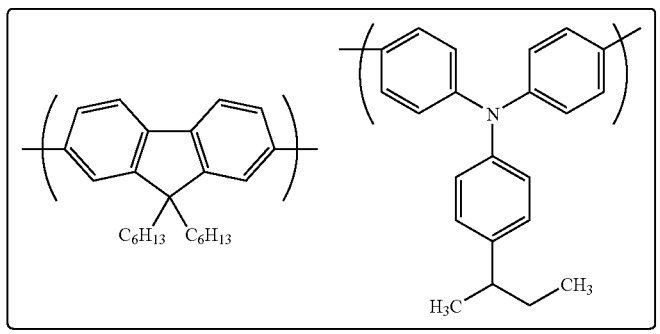

In an inert atmosphere, 2,7-bis(1,3,2-dioxaborolane-2-yl)-9,9-dihexylfluorene (0.72 g), 4,7-dibromo-2,1,3-benzothiadiazole (0.33 g), 4,7-bis(5-bromo-4-methyl-2-thienyl)-2,1,3-benzothiadiazole (0.18 g), 4,7-bis(5-bromo-2-thienyl)-2,1,3-benzothiadiazole (0.08 g), dichlorobis(triphenylphosphine)palladium (3.5 mg), Aliquat 336 (0.22 g, manufactured by Aldrich), and toluene (17 mL) were mixed and heated to 105° C. A 2M $Na_2CO_3$ aqueous solution (5 mL) was dropped into this reaction solution, and the mixture was refluxed for 2 hours. The weight average molecular weight based on polystyrene standards, at this time, was $1.8 \times 10^4$. After cooling to 70° C., 2,7-bis(1,3,2-dioxaborolane-2-yl)-9,9-dihexylfluorene (1.43 g), 2,7-dibromo-9,9-dihexylfluorene (0.62 g), bis(4-bromophenyl)-(4-secondary butylphenyl)-amine (0.73 g), dichlorobis(triphenylphosphine)palladium (6.0 mg), Aliquat 336 (0.37 g, manufactured by Aldrich), and toluene (30 mL) were mixed with the reaction solution and heated to 105° C. A 2M $Na_2CO_3$ aqueous solution (8 mL) was dropped into this reaction solution, and the mixture was refluxed for 5 hours. After reaction, phenyl boric acid (0.05 g) was added, and the mixture was further refluxed for 2 hours. Then, a sodium diethyldithiacarbamate aqueous solution was added, and the mixture was stirred at 80° C. for 2 hours. After cooling, the solution was washed with water (100 mL) two times, with a 3 wt % acetic acid aqueous solution (100 mL) two times, and with water (100 mL) two times, and passed through an alumina column and a silica gel column for purification. The obtained toluene solution was dropped into methanol (1.5 L), and the mixture was stirred for 1 hour, then, the obtained solid was filtered and dried. The yield of the obtained polymer compound <P-2> was 2.24 g.

The polymer compound <P-2> had a polystyrene equivalent number average molecular weight of $1.0 \times 10^5$ and a polystyrene equivalent weight average molecular weight of $2.7 \times 10^5$.

Comparative Example 1

Synthesis of Polymer Compound <P-3>

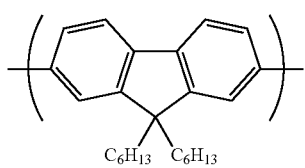

Block B

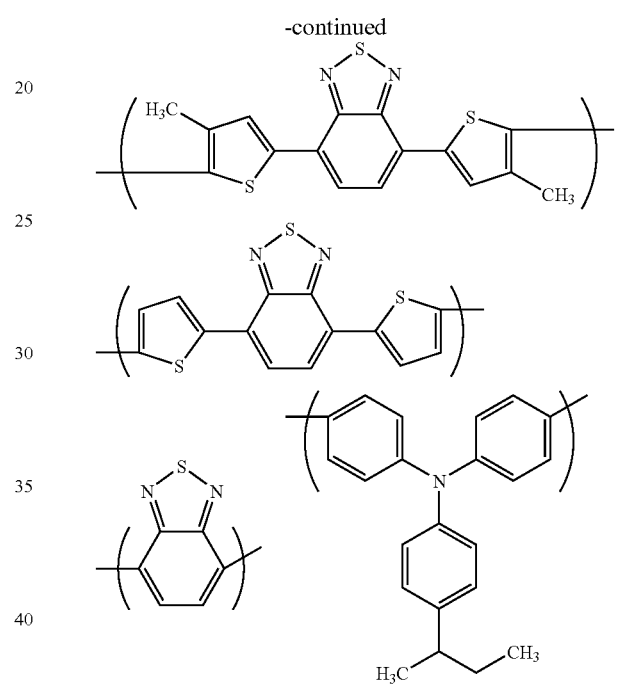

In an inert atmosphere, 2,7-bis(1,3,2-dioxaborolane-2-yl)-9,9-dihexylfluorene (1.90 g), 4,7-dibromo-2,1,3-benzothiadiazole (0.29 g), 4,7-bis(5-bromo-4-methyl-2-thienyl)-2,1,3-benzothiadiazole (0.08 g), 4,7-bis(5-bromo-2-thienyl)-2,1,3-benzothiadiazole (0.02 g), bis(4-bromophenyl)-(4-secondary butylphenyl)-amine (0.55 g), 2,7-dibromo-9,9-dihexylfluorene (0.79 g), dichlorobis(triphenylphosphine)palladium (8.4 mg), Aliquat 336 (0.52 g, manufactured by Aldrich), and toluene (40 mL) were mixed and heated to 105° C. A 2M $Na_2CO_3$ aqueous solution (11 mL) was dropped into this reaction solution, and the mixture was refluxed for 4 hours. The weight average molecular weight based on polystyrene standards, at this time, was $1.6 \times 10^4$. After reaction, phenyl boric acid (0.05 g) was added, and the mixture was further refluxed for 2 hours. Then, a sodium diethyldithiacarbamate aqueous solution was added, and the mixture was stirred at 80° C. for 2 hours. After cooling, the solution was washed with water (100 mL) two times, with a 3 wt % acetic acid aqueous solution (100 mL) two times, and with water (100 mL) two times, and passed through an alumina column and a silica gel column for purification. The obtained toluene solution was dropped into methanol (1 L), and the mixture was stirred for 1 hour, then, the obtained solid was filtered and dried. The yield of the obtained polymer compound <P-3> was 1.76 g.

The polymer compound <P-3> had a polystyrene equivalent number average molecular weight of $5.9 \times 10^4$ and a polystyrene equivalent weight average molecular weight of $1.2 \times 10^5$.

Synthesis Example 1

Synthesis of Polymer Compound <P-4>

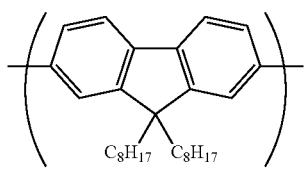

In an inert atmosphere, 2,7-bis(1,3,2-dioxaborolane-2-yl)-9,9-dioctylfluorene (5.20 g), bis(4-bromophenyl)-(4-secondary butylphenyl)-amine (0.14 g), palladium acetate (2.2 mg), tri(2-methylphenyl)phosphine (15.1 mg), Aliquat 336 (0.91 g, manufactured by Aldrich), and toluene (70 mL) were mixed and heated to 105° C. A 2M $Na_2CO_3$ aqueous solution (19 ml) was dropped into this reaction solution, and the mixture was refluxed for 4 hours. After reaction, phenyl boric acid (121 mg) was added, and the mixture was further refluxed for 3 hours. Then, a sodium diethyldithiacarbamate aqueous solution was added, and the mixture was stirred at 80° C. for 4 hours. After cooling, the solution was washed with water (60 ml) three times, with a 3 wt % acetic acid aqueous solution (60 ml) three times, and with water (60 ml) three times, and passed through an alumina column and a silica gel column for purification. The obtained toluene solution was dropped into methanol (3 L), and the mixture was stirred for 3 hours, then, the obtained solid was filtered and dried. The yield of the obtained polymer compound <P-4> was 5.25 g.

The polymer compound <P-4> had a polystyrene equivalent number average molecular weight of $1.2 \times 10^5$ and a polystyrene equivalent weight average molecular weight of $2.6 \times 10^5$.

Comparative Example 2

Synthesis of Polymer Compound <P-5>

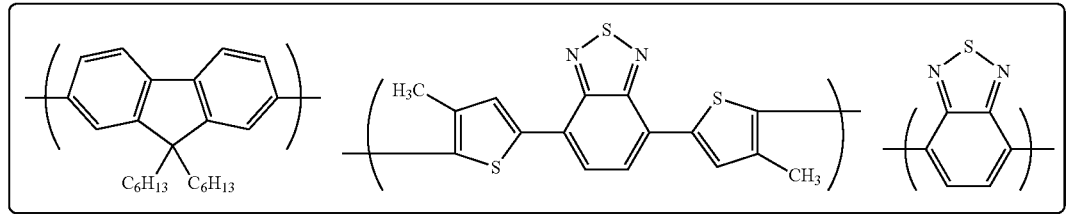

Block A'

Block B

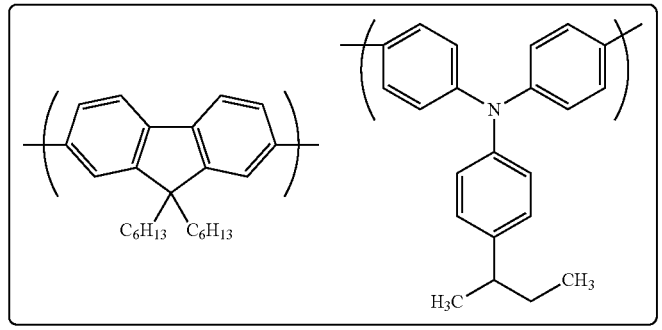

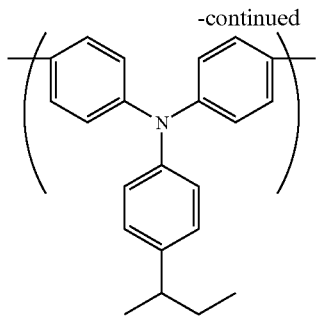

In an inert atmosphere, 2,7-bis(1,3,2-dioxaborolane-2-yl)-9,9-dihexylfluorene (0.77 g), 4,7-dibromo-2,1,3-benzothiadiazole (0.44 g), 4,7-bis(5-bromo-4-methyl-2-thienyl)-2,1,3-benzothiadiazole (0.15 g), dichlorobis(triphenylphosphine) palladium (3.8 mg), Aliquat 336 (0.25 g, manufactured by Aldrich), and toluene (25 mL) were mixed and heated to 105° C. A 2M $Na_2CO_3$ aqueous solution (5 mL) was dropped into this reaction solution, and the mixture was refluxed for 2 hours. The weight average molecular weight based on polystyrene standards, at this time, was $7.2 \times 10^3$. After cooling to 70° C., 2,7-bis(1,3,2-dioxaborolane-2-yl)-9,9-dihexylfluorene (2.09 g), 2,7-dibromo-9,9-dihexylfluorene (1.18 g), bis(4-bromophenyl)-(4-secondary butylphenyl)-amine (0.83 g), dichlorobis(triphenylphosphine)palladium (8.8 mg), Aliquat 336 (0.55 g, manufactured by Aldrich), and toluene (45 mL) were mixed with the reaction solution and heated to 105° C. A 2M $Na_2CO_3$ aqueous solution (11.4 mL) was dropped into this reaction solution, and the mixture was refluxed for 1 hour. After reaction, phenyl boric acid (0.07 g) was added, and the mixture was further refluxed for 2 hours. Then, a sodium diethyldithiacarbamate aqueous solution was added, and the mixture was stirred at 80° C. for 2 hours. After cooling, the solution was washed with water (80 mL) two times, with a 3 wt % acetic acid aqueous solution (80 mL) two times, and with water (80 mL) two times, and passed through an alumina column and a silica gel column for purification. The obtained toluene solution was dropped into methanol (1.0 L), and the mixture was stirred for 1 hour, then, the obtained solid was filtered and dried. The yield of the obtained polymer compound <P-5> was 2.76 g.

The polymer compound <P-5> had a polystyrene equivalent number average molecular weight of $8.8 \times 10^4$ and a polystyrene equivalent weight average molecular weight of $1.9 \times 10^5$.

[Fabrication and Evaluation of Electroluminescent (EL) Device]

Example 3

Fabrication of Light-Emitting Device

A suspension of poly(3,4)ethylenedioxythiophene/polystyrenesulfonic acid (manufactured by Bayer, trade name: BaytronP) was placed on a glass substrate, on which an ITO film having a thickness of 150 nm was provided by a sputtering method, formed into a film having a thickness of about 65 nm by a spin coating method, and dried on a hot plate at 200° C. for 15 minutes. Next, the polymer compound <P-4> was dissolved in mixed xylene at a concentration of 0.5 wt %. The obtained xylene solution was placed on the film of BaytronP, formed into a film by the spin coating method, and then dried in a nitrogen atmosphere with an oxygen concentration of 10 ppm or less and a moisture concentration of 10 ppm or less (on a weight basis) at 180° C. for 15 minutes. Next, the polymer compound <P-1> was dissolved in mixed xylene at a concentration of 1.7 wt %. The obtained xylene solution was placed on the film of the polymer compound <P-4>, formed into a film having a thickness of about 100 nm by the spin coating method, and then dried in a nitrogen atmosphere with an oxygen concentration of 10 ppm or less and a moisture concentration of 10 ppm or less (on a weight basis) at 130° C. for 1 hour. After the pressure was reduced to $1.0 \times 10^{-4}$ Pa or less, as the cathode, about 5 nm of calcium was vapor deposited on the film of the polymer compound <P-1>, and then, about 80 nm of aluminum was vapor deposited on the layer of calcium. After vapor deposition, sealing was performed using a glass substrate to fabricate a polymer light-emitting device. The configuration of the device was as follows:
ITO/BaytronP (about 65 nm)/polymer compound <P-4> (10 nm)/polymer compound <P-1> (about 100 nm)/Ca/Al Performance of EL Device When a voltage of 6.0 V was applied to the obtained polymer light-emitting device, the polymer light-emitting device emitted fluorescence in which the peak top of emission wavelength was 645 nm. At the time, the luminance was 1640 cd/m². The 10% luminance reduction life, with an initial luminance of 1000 cd/m², was 0.79 hour. Also, the luminous efficiency was a maximum value at 3.0 V, was 2.43 cd/A, and was high efficiency.

Example 4

Fabrication of Light-Emitting Device

A polymer light-emitting device was fabricated as in Example 3, except that the polymer compound <P-2> was used instead of the polymer compound <P-1> in Example 3. The configuration of the device was as follows:
ITO/BaytronP (about 65 nm)/polymer compound <P-4> (10 nm)/polymer compound <P-2> (about 100 nm)/Ca/Al Performance of EL Device When a voltage of 6.0 V was applied to the obtained polymer light-emitting device, long-wavelength emission in which the peak top of emission wavelength was 665 nm was obtained. The 10% luminance reduction life, with an initial luminance of 1000 cd/m², was 79.97 hours and was very long life.

Comparative Example 3

Fabrication of Light-Emitting Device

A polymer light-emitting device was fabricated as in Example 3, except that the polymer compound <P-3> was used instead of the polymer compound <P-1> in Example 3. The configuration of the device was as follows:
ITO/BaytronP (about 65 nm)/polymer compound <P-4> (10 nm)/polymer compound <P-3> (about 100 nm)/Ca/Al Performance of EL Device When a voltage of 6.0 V was applied to the obtained polymer light-emitting device, the polymer light-emitting device emitted fluorescence in which the peak top of emission wavelength was 645 nm. At the time, the luminance was 416 cd/m². The 10% luminance reduction life, with an initial luminance of 1000 cd/m², was 0.06 hour and was very short. Also, the luminous efficiency was a maximum value at 3.4 V and was 2.18 cd/A.

INDUSTRIAL APPLICABILITY

As described above, the present invention can provide a block copolymer with which a light-emitting device with long life can be manufactured when it is used as a material of a light-emitting device, and a composition, a liquid composition, a light-emitting thin film, and a polymer light-emitting device using the same.

The block copolymer of the present invention is useful as the light-emitting material, hole transport material, and electron transport material of a light-emitting device, and a light-emitting device comprising the block copolymer of the present invention can be used for a curved light source and a planar light source as the backlight of a liquid crystal display or as illumination, and the like.

The invention claimed is:

1. A block copolymer characterized by comprising:
   a block (A) comprising two or more different types of repeating units represented by the following formula (I), and a repeating unit represented by the following formula (II); and
   a block (B) comprising a repeating unit represented by the following formula (II), and a repeating unit represented by the following formula (III),

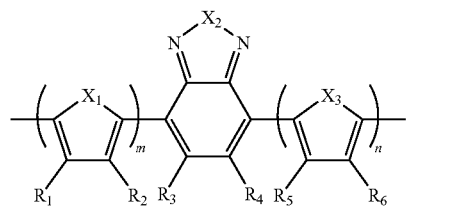
(I)

wherein $R_1$ and $R_6$ independently represent a halogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a cyano group, or a nitro group, wherein $R_2$, $R_3$, $R_4$, and $R_5$ independently represent a hydrogen atom, a halogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a cyano group, or a nitro group, m and n represent 1, and $X_1$, and $X_3$ represent a sulfur atom, $X_2$ represents an oxygen atom, a sulfur atom, or $-C(R_7)=C(R_8)-$ wherein $R_7$ and $R_8$ independently represent a hydrogen atom, a halogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a cyano group, or a nitro group, $$-Ar_1- \quad (II)$$

wherein $Ar_1$ represents an arylene group, and $$-Ar_2- \quad (III)$$

wherein $Ar_2$ represents a divalent aromatic amine residue.

2. The block copolymer according to claim 1, wherein in the formula (I), $X_2$, is a sulfur atom.

3. The block copolymer according to claim 1, wherein in the formula (II), $Ar_1$ is a group represented by the following formula (IV):

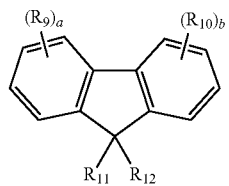
(IV)

wherein $R_9$ and $R_{10}$ independently represent a halogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a cyano group, or a nitro group, and a and b independently represent an integer of 0 to 3, provided that when a plurality of at least one of $R_9$ and $R_{10}$ are present, the plurality of atoms or groups may be the same or different, and $R_{11}$ and $R_{12}$ independently represent a hydrogen atom, a halogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a cyano group, or a nitro group.

4. The block copolymer according to claim 1, wherein in the formula (III), $Ar_2$ is a group represented by the following formula (V):

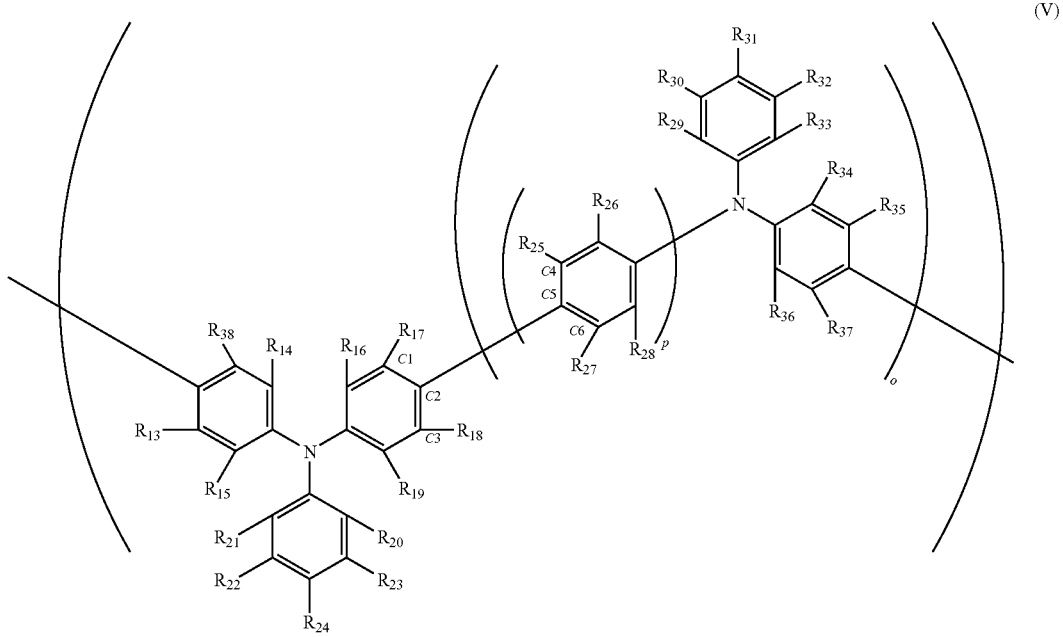

wherein $R_{13}$ to $R_{38}$ independently represent a hydrogen atom, a halogen atom, an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, a monovalent heterocyclic group, a heterocyclic thio group, an amino group, a silyl group, an acyl group, an acyloxy group, an imine residue, an amide group, an acid imide group, a carboxyl group, a cyano group, or a nitro group, o and p independently represent 0 or 1, and C1 to C6 each represent the position of a carbon atom, provided that at least one of combinations of $R_{14}$ and $R_{16}$, $R_{15}$ and $R_{21}$, $R_{28}$ and $R_{36}$, and $R_{33}$ and $R_{34}$ may be taken together to form a single bond or a divalent group represented by the formula: —O— or the formula: —S—, instead of representing the above atom or group, a combination of $R_{17}$ and $R_{25}$ may be taken together to form a single bond or a divalent group to form a ring with carbon atoms at the C1 position, the C2 position, the C4 position, and the C5 position, instead of representing the above atom or group, and a combination of $R_{18}$ and $R_{27}$ may be taken together to form a single bond or a divalent group to form a ring with carbon atoms at the C2 position, the C3 position, the C5 position, and the C6 position, instead of representing the above atom or group.

5. The block copolymer according to claim 1, wherein a content of a total of two or more different types of repeating units represented by the formula (I) is 3 mol % or more and 40 mol % or less, with respect to all repeating units in the block copolymer.

6. The block copolymer according to claim 1, having a polystyrene equivalent weight average molecular weight of $1 \times 10^3$ to $1 \times 10^7$.

7. The block copolymer according to claim 1, wherein the block (A) has a polystyrene equivalent weight average molecular weight of $1 \times 10^3$ to $1 \times 10^5$.

8. The block copolymer according to claim 1, wherein [A]/[B] is 0.1 or more and 10 or less, wherein [A] represents a mole fraction of the block (A) with respect to a total of the blocks (A) and (B), and [B] represents a mole fraction of the block (B) with respect to the total of the blocks (A) and (B).

9. A composition comprising:
the block copolymer according to claim 1; and
a solvent, a light-emitting material other than the block copolymer, a hole transport material other than the block copolymer, or an electron transport material other than the block copolymer, or a combination of two or more thereof.

10. The composition according to claim 9, containing at least two types of the block copolymers.

11. A light-emitting thin film characterized by comprising the block copolymer according to claim 1.

12. The light-emitting thin film according to claim 11, further containing a light-emitting material other than the block copolymer, a hole transport material other than the block copolymer, or an electron transport material other than the block copolymer, or a combination of two or more thereof.

13. A polymer light-emitting device characterized by comprising:
an anode;
a cathode; and
an organic layer comprising the block copolymer according to claim 1 and provided between the anode and the cathode.

14. The polymer light-emitting device according to claim 13, wherein the organic layer further comprises a light-emitting material other than the block copolymer, a hole transport material other than the block copolymer, or an electron transport material other than the block copolymer, or a combination of two or more thereof.

15. The polymer light-emitting device according to claim 13, wherein the organic layer is a light-emitting layer.

\* \* \* \* \*